United States Patent
Reid

(10) Patent No.: US 10,553,511 B2
(45) Date of Patent: Feb. 4, 2020

(54) INTEGRATED CHIP SCALE PACKAGES

(71) Applicant: Cubic Corporation, San Diego, CA (US)

(72) Inventor: J. Robert Reid, Billerica, MA (US)

(73) Assignee: CUBIC CORPORATION, San Diego, CA (US)

( * ) Notice: Subject to any disclaimer, the term of this patent is extended or adjusted under 35 U.S.C. 154(b) by 0 days.

(21) Appl. No.: 16/433,539

(22) Filed: Jun. 6, 2019

(65) Prior Publication Data

US 2019/0287869 A1 Sep. 19, 2019

Related U.S. Application Data

(63) Continuation of application No. 15/829,288, filed on Dec. 1, 2017, now Pat. No. 10,319,654.

(51) Int. Cl.
*H01L 23/13* (2006.01)
*H01L 23/00* (2006.01)
(Continued)

(52) U.S. Cl.
CPC ............ *H01L 23/13* (2013.01); *H01L 21/486* (2013.01); *H01L 21/4857* (2013.01); *H01L 21/52* (2013.01); *H01L 23/055* (2013.01); *H01L 23/49822* (2013.01); *H01L 23/49827* (2013.01); *H01L 23/66* (2013.01); *H01L 24/66* (2013.01); *H01L 24/81* (2013.01); *H01L 24/85* (2013.01); *H01P 3/06* (2013.01); *H01L 24/16* (2013.01); *H01L 24/29* (2013.01); *H01L 24/32* (2013.01); *H01L 24/48* (2013.01); *H01L 24/73* (2013.01); *H01L 24/92* (2013.01); *H01L 2223/6611* (2013.01); *H01L 2223/6627* (2013.01);
(Continued)

(58) Field of Classification Search
CPC . H01L 21/4857; H01L 21/486; H01L 23/043; H01L 23/045; H01L 23/055; H01L 23/13; H01L 23/142; H01L 23/481; H01L 24/16; H01L 24/48; H01L 24/66; H01L 24/81; H01L 24/85; H01L 2924/1423; H01P 3/06
See application file for complete search history.

(56) References Cited

U.S. PATENT DOCUMENTS

| 731,445 A | 6/1903 | Esterly |
|---|---|---|
| 2,743,505 A | 5/1956 | George |

(Continued)

FOREIGN PATENT DOCUMENTS

| CA | 2055116 A1 | 5/1992 |
|---|---|---|
| CN | 1094450 A | 11/1994 |

(Continued)

OTHER PUBLICATIONS

Brown et al., 'A Low-Loss Ka-Band Filter in Rectangular Coax Made by Electrochemical Fabrication', submitted to Microwave and Wireless Components Letters, date unknown {downloaded from www.memgen.com, 2004). NPL_1.
(Continued)

*Primary Examiner* — Earl N Taylor
(74) *Attorney, Agent, or Firm* — Niels Haun; Dann, Dorfman, Herrell & Skillman P.C.

(57) ABSTRACT

Chip scale package such as a chip scale package having a chip integrated therein to provide an integrated chip scale package.

19 Claims, 7 Drawing Sheets

(51) Int. Cl.
*H01L 23/055* (2006.01)
*H01L 21/48* (2006.01)
*H01L 21/52* (2006.01)
*H01P 3/06* (2006.01)
*H01L 23/66* (2006.01)
*H01L 23/498* (2006.01)

(52) U.S. Cl.
CPC ............. *H01L 2223/6683* (2013.01); *H01L 2224/131* (2013.01); *H01L 2224/16225* (2013.01); *H01L 2224/16227* (2013.01); *H01L 2224/291* (2013.01); *H01L 2224/2919* (2013.01); *H01L 2224/32225* (2013.01); *H01L 2224/48097* (2013.01); *H01L 2224/48229* (2013.01); *H01L 2224/73265* (2013.01); *H01L 2224/92247* (2013.01); *H01L 2924/00014* (2013.01); *H01L 2924/19033* (2013.01)

(56) References Cited

U.S. PATENT DOCUMENTS

| | | | |
|---|---|---|---|
| 2,812,501 A | 11/1957 | Sommers | |
| 2,914,766 A | 11/1959 | Butler | |
| 2,941,688 A * | 6/1960 | Chamberlin | H01J 5/28 257/710 |
| 2,997,519 A | 8/1961 | Hines | |
| 3,017,550 A * | 1/1962 | Dickson, Jr. | H01L 23/045 257/711 |
| 3,039,175 A * | 6/1962 | Dixon, Jr. | H01L 23/045 29/855 |
| 3,119,052 A * | 1/1964 | Tsuji | H01L 23/045 257/711 |
| 3,140,530 A * | 7/1964 | Certa | B23K 20/233 228/116 |
| 3,157,847 A | 11/1964 | Williams | |
| 3,309,632 A | 3/1967 | Trudeau | |
| 3,311,966 A | 4/1967 | Henry | |
| 3,335,489 A | 8/1967 | Grant | |
| 3,352,730 A | 11/1967 | Murch | |
| 3,464,855 A | 9/1969 | Quintana | |
| 3,489,845 A * | 1/1970 | Landron | H01L 21/4807 174/556 |
| 3,526,867 A | 9/1970 | Keeler | |
| 3,528,102 A * | 9/1970 | Rodet | C03C 29/00 257/699 |
| 3,537,043 A | 10/1970 | Smith | |
| 3,560,896 A | 2/1971 | Essinger | |
| 3,577,105 A | 5/1971 | Jones, Jr. | |
| 3,585,272 A * | 6/1971 | Shatz | H01L 23/045 174/548 |
| 3,598,107 A | 8/1971 | Ishikawa | |
| 3,618,203 A * | 11/1971 | Pryor | C03C 27/02 257/708 |
| 3,730,969 A * | 5/1973 | Buttle | H01L 23/055 174/528 |
| 3,735,208 A * | 5/1973 | Roswell | H01L 23/045 257/782 |
| 3,735,209 A * | 5/1973 | Saddler | H01L 23/045 257/660 |
| 3,760,306 A | 9/1973 | Spinner | |
| 3,775,844 A | 12/1973 | Parks | |
| 3,789,129 A | 1/1974 | Ditscheid | |
| 3,791,858 A | 2/1974 | McPherson | |
| 3,831,066 A * | 8/1974 | Gabrail | H01L 23/045 257/710 |
| 3,884,549 A | 5/1975 | Wang | |
| 3,925,883 A | 12/1975 | Cavalear | |
| 3,938,178 A * | 2/1976 | Miura | H01L 21/00 257/590 |
| 3,963,999 A | 6/1976 | Nakajima | |
| 4,015,071 A * | 3/1977 | Peet | H01L 21/50 174/559 |
| 4,021,789 A | 5/1977 | Furman | |
| 4,033,656 A | 7/1977 | Freehauf | |
| 4,075,757 A | 2/1978 | Malm | |
| 4,128,697 A * | 12/1978 | Simpson | C03C 8/24 174/152 GM |
| 4,275,944 A | 6/1981 | Sochor | |
| 4,298,769 A | 11/1981 | Richman | |
| 4,348,253 A | 9/1982 | Subbarao | |
| 4,365,222 A | 12/1982 | Lampert | |
| 4,382,327 A * | 5/1983 | Bardens | H01L 23/045 174/564 |
| 4,414,424 A | 11/1983 | Mizoguchi | |
| 4,417,393 A | 11/1983 | Becker | |
| 4,437,074 A | 3/1984 | Cohen | |
| 4,521,755 A | 6/1985 | Carlson | |
| 4,539,534 A | 9/1985 | Hudspeth | |
| 4,581,301 A | 4/1986 | Michaelson | |
| 4,591,411 A | 5/1986 | Reimann | |
| 4,641,140 A | 2/1987 | Heckaman | |
| 4,647,878 A | 3/1987 | Landis | |
| 4,661,835 A * | 4/1987 | Gadennann | H01L 23/142 228/123.1 |
| 4,663,497 A | 5/1987 | Reimann | |
| 4,673,904 A | 6/1987 | Landis | |
| 4,677,393 A | 6/1987 | Sharma | |
| 4,684,181 A | 8/1987 | Massit | |
| 4,700,159 A | 10/1987 | Jones | |
| 4,717,064 A | 1/1988 | Popielarski | |
| 4,729,510 A | 3/1988 | Landis | |
| 4,771,294 A | 9/1988 | Wasilousky | |
| 4,771,630 A | 9/1988 | Croce | |
| 4,808,273 A | 2/1989 | Hua | |
| 4,832,461 A | 5/1989 | Yamagishi | |
| 4,853,656 A | 8/1989 | Guillou | |
| 4,856,184 A | 8/1989 | Doeling | |
| 4,857,418 A | 8/1989 | Schuetz | |
| 4,859,806 A | 8/1989 | Smith | |
| 4,876,322 A | 10/1989 | Budde | |
| 4,880,684 A | 11/1989 | Boss | |
| 4,885,662 A * | 12/1989 | Bartholomew | H01L 23/045 361/716 |
| 4,893,499 A | 1/1990 | Layton | |
| 4,897,711 A | 1/1990 | Blonder | |
| 4,909,909 A | 3/1990 | Florjancic | |
| 4,915,983 A | 4/1990 | Lake | |
| 4,969,979 A | 11/1990 | Appelt | |
| 4,975,142 A | 12/1990 | Iannacone | |
| 5,025,347 A * | 6/1991 | Shindo | H01L 23/045 257/697 |
| 5,032,897 A | 7/1991 | Mansuria | |
| 5,069,749 A | 12/1991 | Gutierrez | |
| 5,072,201 A | 12/1991 | Devaux | |
| 5,082,339 A | 1/1992 | Linnebach | |
| 5,082,366 A | 1/1992 | Tyson, II | |
| 5,089,880 A * | 2/1992 | Meyer | H01L 23/32 257/692 |
| 5,098,864 A * | 3/1992 | Mahulikar | H01L 23/055 257/E23.067 |
| 5,100,501 A | 3/1992 | Blumenthal | |
| 5,117,753 A | 6/1992 | Mamberer | |
| 5,119,049 A | 6/1992 | Heller | |
| 5,177,753 A | 1/1993 | Tanaka | |
| 5,191,699 A | 3/1993 | Ganslmeier | |
| 5,201,987 A | 4/1993 | Hawkins | |
| 5,213,511 A | 5/1993 | Sobhani | |
| 5,227,013 A | 7/1993 | Kumar | |
| 5,229,549 A * | 7/1993 | Yamakawa | H01L 21/486 174/258 |
| 5,231,686 A | 7/1993 | Rabinovich | |
| 5,235,208 A | 8/1993 | Katoh | |
| 5,259,054 A | 11/1993 | Benzoni | |
| 5,262,921 A | 11/1993 | Lamers | |
| 5,274,484 A | 12/1993 | Mochizuki | |
| 5,287,001 A | 2/1994 | Buchmann | |
| 5,289,345 A | 2/1994 | Corradetti | |
| 5,291,572 A | 3/1994 | Blonder | |
| 5,299,939 A | 4/1994 | Walker | |
| 5,307,139 A | 4/1994 | Tyson | |
| 5,308,442 A | 5/1994 | Taub | |

(56) References Cited

U.S. PATENT DOCUMENTS

| | | | |
|---|---|---|---|
| 5,312,456 A | 5/1994 | Reed | |
| 5,327,443 A | 7/1994 | Tanaka | |
| 5,334,956 A | 8/1994 | Leding | |
| 5,351,163 A | 9/1994 | Dawson | |
| 5,381,157 A | 1/1995 | Shiga | |
| 5,381,596 A | 1/1995 | Ferro | |
| 5,390,271 A | 2/1995 | Priest | |
| 5,406,235 A | 4/1995 | Hayashi | |
| 5,406,423 A | 4/1995 | Hayashi | |
| 5,412,748 A | 5/1995 | Furuyama | |
| 5,430,257 A | 7/1995 | Lau | |
| 5,432,998 A | 7/1995 | Galasco | |
| 5,448,014 A | 9/1995 | Kong | |
| 5,454,161 A | 10/1995 | Beilin | |
| 5,459,923 A * | 10/1995 | Montesano | H01L 21/486 106/1.12 |
| 5,479,540 A | 12/1995 | Boudreau | |
| 5,485,039 A * | 1/1996 | Fujita | H01L 23/473 257/774 |
| 5,529,504 A | 6/1996 | Greenstein | |
| 5,552,635 A | 9/1996 | Kim | |
| 5,622,588 A * | 4/1997 | Weber | H01L 21/4803 156/263 |
| 5,622,895 A | 4/1997 | Frank | |
| 5,633,615 A | 5/1997 | Quan | |
| 5,682,062 A | 10/1997 | Gaul | |
| 5,682,124 A | 10/1997 | Suski | |
| 5,712,607 A | 1/1998 | Dittmer | |
| 5,713,508 A | 2/1998 | Gaynes | |
| 5,724,012 A | 3/1998 | Teunisse | |
| 5,727,104 A | 3/1998 | Sasaki | |
| 5,740,261 A | 4/1998 | Loeppert | |
| 5,742,261 A | 4/1998 | Yuki | |
| 5,746,868 A | 5/1998 | Abe | |
| 5,793,272 A | 8/1998 | Burghartz | |
| 5,798,557 A | 8/1998 | Salatino | |
| 5,812,717 A | 9/1998 | Gilliland | |
| 5,814,889 A | 9/1998 | Gaul | |
| 5,847,453 A * | 12/1998 | Uematsu | H01L 23/045 257/728 |
| 5,860,812 A | 1/1999 | Gugliotti | |
| 5,872,399 A | 2/1999 | Lee | |
| 5,891,354 A | 4/1999 | Lee | |
| 5,898,991 A * | 5/1999 | Fogel | H01F 27/2804 29/602.1 |
| 5,903,059 A | 5/1999 | Bertin | |
| 5,915,168 A | 6/1999 | Salatino | |
| 5,925,206 A | 7/1999 | Boyko | |
| 5,940,674 A | 8/1999 | Sachs | |
| 5,961,347 A | 10/1999 | Hsu | |
| 5,966,291 A | 10/1999 | Baeumel | |
| 5,977,842 A | 11/1999 | Brown | |
| 5,978,220 A | 11/1999 | Frey | |
| 5,990,768 A | 11/1999 | Takahashi | |
| 6,008,102 A | 12/1999 | Alford | |
| 6,027,630 A | 2/2000 | Cohen | |
| 6,036,872 A | 3/2000 | Wood | |
| 6,054,252 A | 4/2000 | Lundy | |
| 6,091,027 A | 7/2000 | Hesselbom | |
| 6,091,603 A | 7/2000 | Daves | |
| 6,094,919 A | 8/2000 | Bhatia | |
| 6,101,705 A | 8/2000 | Wolfson | |
| 6,110,825 A | 8/2000 | Mastromatteo | |
| 6,133,631 A | 10/2000 | Belady | |
| 6,139,761 A | 10/2000 | Ohkuma | |
| 6,167,751 B1 | 1/2001 | Fraim | |
| 6,180,261 B1 | 1/2001 | Inoue | |
| 6,183,268 B1 | 2/2001 | Consoli | |
| 6,207,892 B1 * | 3/2001 | Lucey, Jr. | H01L 23/045 174/17 LF |
| 6,207,901 B1 | 3/2001 | Smith | |
| 6,207,950 B1 | 3/2001 | Verdiell | |
| 6,210,221 B1 | 4/2001 | Maury | |
| 6,221,769 B1 | 4/2001 | Dhong | |
| 6,228,466 B1 | 5/2001 | Tsukada | |
| 6,228,675 B1 | 5/2001 | Ruby | |
| 6,232,669 B1 | 5/2001 | Khoury | |
| 6,262,477 B1 * | 7/2001 | Mahulikar | H01L 23/055 257/698 |
| 6,275,513 B1 | 8/2001 | Chang-Hasnain | |
| 6,294,965 B1 | 9/2001 | Merrill | |
| 6,329,605 B1 | 12/2001 | Beroz | |
| 6,350,633 B1 | 2/2002 | Lin | |
| 6,351,027 B1 | 2/2002 | Giboney | |
| 6,354,747 B1 | 3/2002 | Irie | |
| 6,358,066 B1 | 3/2002 | Gilliland | |
| 6,359,333 B1 | 3/2002 | Wood | |
| 6,388,198 B1 | 5/2002 | Berlin | |
| 6,392,158 B1 | 5/2002 | Caplet | |
| 6,422,766 B1 * | 7/2002 | Althaus | G02B 6/4259 385/94 |
| 6,439,032 B1 | 8/2002 | Lehmann | |
| 6,452,798 B1 | 9/2002 | Smith | |
| 6,457,979 B1 | 10/2002 | Dove | |
| 6,465,747 B2 | 10/2002 | DiStefano | |
| 6,466,112 B1 | 10/2002 | Kwon | |
| 6,477,056 B1 * | 11/2002 | Edwards | G02B 6/4214 361/752 |
| 6,514,845 B1 | 2/2003 | Eng | |
| 6,518,165 B1 * | 2/2003 | Yoon | H01L 23/522 257/E23.142 |
| 6,535,088 B1 | 3/2003 | Sherman | |
| 6,538,312 B1 | 3/2003 | Peterson | |
| 6,582,992 B2 | 6/2003 | Poo | |
| 6,589,594 B1 | 7/2003 | Hembree | |
| 6,590,295 B1 | 7/2003 | Liao | |
| 6,600,395 B1 | 7/2003 | Handforth | |
| 6,603,376 B1 | 8/2003 | Handforth | |
| 6,611,052 B2 | 8/2003 | Poo | |
| 6,648,653 B2 | 11/2003 | Huang | |
| 6,660,564 B2 | 12/2003 | Brady | |
| 6,662,443 B2 | 12/2003 | Chou | |
| 6,677,248 B2 | 1/2004 | Kwon | |
| 6,735,009 B2 | 5/2004 | Li | |
| 6,746,158 B2 | 6/2004 | Merrick | |
| 6,746,891 B2 | 6/2004 | Cunningham | |
| 6,749,737 B2 | 6/2004 | Cheng | |
| 6,768,205 B2 | 7/2004 | Taniguchi | |
| 6,773,532 B2 | 8/2004 | Wolf | |
| 6,776,623 B1 | 8/2004 | Yunker | |
| 6,781,057 B2 * | 8/2004 | Reznik | H01L 23/045 174/550 |
| 6,800,360 B2 | 10/2004 | Miyanaga | |
| 6,800,555 B2 | 10/2004 | Test | |
| 6,818,464 B2 | 11/2004 | Heschel | |
| 6,827,608 B2 | 12/2004 | Hall | |
| 6,831,371 B1 * | 12/2004 | Huemoeller | H01L 23/49827 174/260 |
| 6,843,107 B2 | 1/2005 | Newman | |
| 6,850,084 B2 | 2/2005 | Hembree | |
| 6,864,172 B2 | 3/2005 | Noma | |
| 6,868,214 B1 | 3/2005 | Sakata | |
| 6,888,427 B2 | 5/2005 | Sinsheimer | |
| 6,889,433 B1 | 5/2005 | Enomoto | |
| 6,914,513 B1 | 7/2005 | Wahlers | |
| 6,917,086 B2 | 7/2005 | Cunningham | |
| 6,943,452 B2 | 9/2005 | Berlin | |
| 6,971,913 B1 | 12/2005 | Chu | |
| 6,975,267 B2 | 12/2005 | Stenger | |
| 6,981,414 B2 | 1/2006 | Knowles | |
| 6,992,887 B2 | 1/2006 | Jairazbhoy | |
| 7,005,750 B2 | 2/2006 | Liu | |
| 7,012,489 B2 | 3/2006 | Sherrer | |
| 7,030,712 B2 | 4/2006 | Brunette | |
| 7,064,449 B2 | 6/2006 | Lin | |
| 7,077,697 B2 | 7/2006 | Kooiman | |
| 7,084,722 B2 | 8/2006 | Goyette | |
| D530,674 S | 10/2006 | Ko | |
| 7,116,190 B2 | 10/2006 | Brunker | |
| 7,129,163 B2 | 10/2006 | Sherrer | |
| 7,148,141 B2 | 12/2006 | Shim | |
| 7,148,722 B1 | 12/2006 | Cliff | |
| 7,148,772 B2 | 12/2006 | Sherrer | |

(56) References Cited

U.S. PATENT DOCUMENTS

| | | | |
|---|---|---|---|
| 7,160,039 B2 | 1/2007 | Hargis | |
| 7,165,974 B2 | 1/2007 | Kooiman | |
| 7,217,156 B2 | 5/2007 | Wang | |
| 7,221,048 B2* | 5/2007 | Daeche | H01L 21/4857 |
| | | | 257/690 |
| 7,222,420 B2 | 5/2007 | Moriizumi | |
| 7,239,219 B2 | 7/2007 | Brown | |
| 7,252,861 B2 | 8/2007 | Smalley | |
| 7,259,640 B2 | 8/2007 | Brown | |
| 7,383,632 B2 | 6/2008 | Dittmann | |
| 7,388,388 B2 | 6/2008 | Dong | |
| 7,400,222 B2 | 7/2008 | Kwon | |
| 7,405,638 B2 | 7/2008 | Sherrer | |
| 7,449,784 B2 | 11/2008 | Sherrer | |
| 7,478,475 B2 | 1/2009 | Hall | |
| 7,508,065 B2 | 3/2009 | Sherrer | |
| 7,532,163 B2 | 5/2009 | Chang | |
| 7,555,309 B2 | 6/2009 | Baldor | |
| 7,575,474 B1 | 8/2009 | Dodson | |
| 7,579,553 B2 | 8/2009 | Moriizumi | |
| 7,602,059 B2 | 10/2009 | Nobutaka | |
| 7,619,441 B1 | 11/2009 | Rahman | |
| 7,628,617 B2 | 12/2009 | Brown | |
| 7,629,541 B2* | 12/2009 | Caletka | H05K 1/0219 |
| | | | 174/260 |
| 7,633,159 B2 | 12/2009 | Boon | |
| 7,645,147 B2 | 1/2010 | Dittmann | |
| 7,645,940 B2 | 1/2010 | Shepherd | |
| 7,649,432 B2 | 1/2010 | Sherrer | |
| 7,656,256 B2 | 2/2010 | Houck | |
| 7,658,831 B2 | 2/2010 | Mathieu | |
| 7,683,842 B1 | 3/2010 | Engel | |
| 7,704,796 B2 | 4/2010 | Pagaila | |
| 7,705,456 B2 | 4/2010 | Hu | |
| 7,741,853 B2 | 6/2010 | Blakely | |
| 7,755,174 B2 | 7/2010 | Rollin | |
| 7,898,356 B2 | 3/2011 | Sherrer | |
| 7,948,335 B2 | 5/2011 | Sherrer | |
| 8,011,959 B1 | 9/2011 | Tsai | |
| 8,031,037 B2 | 10/2011 | Sherrer | |
| 8,188,932 B2 | 5/2012 | Worl | |
| 8,203,207 B2 | 6/2012 | Getz | |
| 8,264,297 B2 | 9/2012 | Thompson | |
| 8,304,666 B2 | 11/2012 | Ko | |
| 8,339,232 B2 | 12/2012 | Lotfi | |
| 8,394,679 B2* | 3/2013 | Eaton | B81C 1/00269 |
| | | | 257/E21.499 |
| 8,441,118 B2 | 5/2013 | Hua | |
| 8,522,430 B2 | 9/2013 | Kacker | |
| 8,542,079 B2 | 9/2013 | Sherrer | |
| 8,641,428 B2 | 2/2014 | Light | |
| 8,674,872 B2 | 3/2014 | Billaud | |
| 8,742,874 B2 | 6/2014 | Sherrer | |
| 8,814,601 B1* | 8/2014 | Sherrer | H01R 4/34 |
| | | | 439/625 |
| 8,866,300 B1 | 10/2014 | Sherrer | |
| 8,888,504 B2 | 11/2014 | Pischler | |
| 8,993,450 B2 | 3/2015 | Sherrer | |
| 9,000,863 B2 | 4/2015 | Sherrer | |
| 9,153,863 B2* | 10/2015 | Nair | H01Q 1/38 |
| 9,306,254 B1 | 4/2016 | Hovey | |
| 9,325,044 B2 | 4/2016 | Reid | |
| 9,410,799 B2 | 8/2016 | Sherrer | |
| 9,505,613 B2 | 11/2016 | Sherrer | |
| 9,536,843 B2 | 1/2017 | Takagi | |
| 9,583,856 B2 | 2/2017 | Sherrer | |
| 9,633,976 B1 | 4/2017 | Bernstein | |
| 9,786,975 B2 | 10/2017 | Kocurek | |
| 9,817,199 B2 | 11/2017 | Sherrer | |
| 9,888,600 B2 | 2/2018 | Hovey | |
| 10,193,203 B2 | 1/2019 | Rollin | |
| 10,254,499 B1 | 4/2019 | Cohen | |
| 2001/0040051 A1 | 11/2001 | Lipponen | |
| 2001/0045361 A1 | 11/2001 | Boone | |
| 2002/0030266 A1* | 3/2002 | Murata | H01L 23/49827 |
| | | | 257/698 |
| 2002/0037143 A1 | 3/2002 | Kuhara | |
| 2002/0057883 A1* | 5/2002 | Malone | G02B 6/4201 |
| | | | 385/136 |
| 2002/0074565 A1 | 6/2002 | Flagan | |
| 2002/0075104 A1 | 6/2002 | Kwon | |
| 2002/0111035 A1 | 8/2002 | Atobe | |
| 2002/0113296 A1 | 8/2002 | Cho | |
| 2002/0127768 A1 | 9/2002 | Badir | |
| 2003/0029729 A1 | 2/2003 | Cheng | |
| 2003/0034438 A1 | 2/2003 | Sherrer | |
| 2003/0045085 A1 | 3/2003 | Williams | |
| 2003/0052755 A1 | 3/2003 | Barnes | |
| 2003/0071283 A1 | 4/2003 | Heschel | |
| 2003/0081914 A1 | 5/2003 | Steinberg | |
| 2003/0104651 A1 | 6/2003 | Kim | |
| 2003/0117237 A1 | 6/2003 | Niu | |
| 2003/0128854 A1 | 7/2003 | Mullenborn | |
| 2003/0159772 A1 | 8/2003 | Wolf | |
| 2003/0161026 A1 | 8/2003 | Qin | |
| 2003/0161133 A1 | 8/2003 | Fu | |
| 2003/0161363 A1 | 8/2003 | Wolf | |
| 2003/0161603 A1 | 8/2003 | Nadeau | |
| 2003/0169983 A1 | 9/2003 | Branch | |
| 2003/0183920 A1 | 10/2003 | Goodrich | |
| 2003/0183921 A1 | 10/2003 | Komobuchi | |
| 2003/0206703 A1 | 11/2003 | Chiu | |
| 2003/0221968 A1 | 12/2003 | Cohen | |
| 2003/0222738 A1 | 12/2003 | Brown | |
| 2004/0000701 A1 | 1/2004 | White | |
| 2004/0004061 A1 | 1/2004 | Merdan | |
| 2004/0007468 A1 | 1/2004 | Cohen | |
| 2004/0007470 A1 | 1/2004 | Smalley | |
| 2004/0012083 A1 | 1/2004 | Farrell | |
| 2004/0016942 A1 | 1/2004 | Miyazawa | |
| 2004/0038586 A1 | 2/2004 | Hall | |
| 2004/0067604 A1 | 4/2004 | Ouellet | |
| 2004/0076384 A1 | 4/2004 | Kato | |
| 2004/0076806 A1 | 4/2004 | Miyanaga | |
| 2004/0077117 A1 | 4/2004 | Ding | |
| 2004/0077139 A1 | 4/2004 | Silverbrook | |
| 2004/0091268 A1 | 5/2004 | Hogan | |
| 2004/0101259 A1 | 5/2004 | Kilian | |
| 2004/0104460 A1 | 6/2004 | Stark | |
| 2004/0124961 A1 | 7/2004 | Aoyagi | |
| 2004/0188822 A1 | 9/2004 | Hara | |
| 2004/0196112 A1 | 10/2004 | Welbon | |
| 2004/0240497 A1 | 12/2004 | Oomori | |
| 2004/0263290 A1 | 12/2004 | Sherrer | |
| 2004/0264866 A1 | 12/2004 | Sherrer | |
| 2005/0013977 A1 | 1/2005 | Wong | |
| 2005/0030124 A1 | 2/2005 | Okamoto | |
| 2005/0042932 A1 | 2/2005 | Mok | |
| 2005/0045484 A1 | 3/2005 | Smalley | |
| 2005/0059204 A1 | 3/2005 | Heschel | |
| 2005/0110157 A1 | 5/2005 | Sherrer | |
| 2005/0111797 A1 | 5/2005 | Sherrer | |
| 2005/0135758 A1 | 6/2005 | Sato | |
| 2005/0141828 A1 | 6/2005 | Narayan | |
| 2005/0156693 A1 | 7/2005 | Dove | |
| 2005/0214979 A1* | 9/2005 | Suzuki | H01L 21/50 |
| | | | 438/118 |
| 2005/0230145 A1 | 10/2005 | Ishii | |
| 2005/0250253 A1* | 11/2005 | Cheung | B81C 1/00293 |
| | | | 438/125 |
| 2005/0265722 A1 | 12/2005 | Gallup | |
| 2005/0286901 A1 | 12/2005 | Sasser | |
| 2006/0002667 A1 | 1/2006 | Aronson | |
| 2006/0072883 A1 | 4/2006 | Kilian | |
| 2006/0094158 A1 | 5/2006 | Lee | |
| 2006/0094231 A1 | 5/2006 | Lane | |
| 2006/0134939 A1 | 6/2006 | Oldfield | |
| 2006/0197215 A1* | 9/2006 | Potter | B81C 1/00269 |
| | | | 257/704 |
| 2006/0278821 A1 | 12/2006 | Sherrer | |
| 2007/0002927 A1 | 1/2007 | Finot | |
| 2007/0065079 A1* | 3/2007 | Mitamura | G02B 6/4201 |
| | | | 385/88 |

(56) References Cited

U.S. PATENT DOCUMENTS

| | | |
|---|---|---|
| 2007/0081770 A1 | 4/2007 | Fisher |
| 2007/0115076 A1* | 5/2007 | Khazanov ............... H01P 1/127 333/105 |
| 2007/0262381 A1 | 11/2007 | Kojima |
| 2007/0278666 A1 | 12/2007 | Garcia |
| 2008/0042142 A1* | 2/2008 | Sugawara ............. C08G 77/04 257/77 |
| 2008/0076195 A1 | 3/2008 | Shiv |
| 2008/0164573 A1* | 7/2008 | Basker ................. H01L 21/486 257/621 |
| 2008/0191817 A1 | 8/2008 | Sherrer |
| 2008/0197946 A1 | 8/2008 | Houck |
| 2008/0199656 A1 | 8/2008 | Nichols |
| 2008/0240656 A1 | 10/2008 | Rollin |
| 2008/0265397 A1 | 10/2008 | Lin |
| 2009/0004385 A1 | 1/2009 | Blackwell |
| 2009/0051476 A1 | 2/2009 | Tada |
| 2009/0065907 A1 | 3/2009 | Haba |
| 2009/0127698 A1* | 5/2009 | Rathburn ........... H01R 13/2464 257/698 |
| 2009/0154972 A1 | 6/2009 | Tanaka |
| 2009/0242926 A1* | 10/2009 | Kimura ................ H01L 23/055 257/99 |
| 2009/0267096 A1 | 10/2009 | Kim |
| 2010/0007016 A1 | 1/2010 | Oppermann |
| 2010/0015850 A1 | 1/2010 | Stein |
| 2010/0053922 A1* | 3/2010 | Ebefors ................ H01L 21/762 361/772 |
| 2010/0109819 A1 | 5/2010 | Houck |
| 2010/0225435 A1 | 9/2010 | Li |
| 2010/0259913 A1* | 10/2010 | Coburn ................ H01L 23/552 361/809 |
| 2010/0296252 A1 | 11/2010 | Rollin |
| 2010/0323551 A1 | 12/2010 | Eldridge |
| 2011/0079893 A1 | 4/2011 | Sherrer |
| 2011/0123783 A1 | 5/2011 | Sherrer |
| 2011/0123794 A1 | 5/2011 | Hiller |
| 2011/0181376 A1 | 7/2011 | Vanhille |
| 2011/0181377 A1 | 7/2011 | Vanhille |
| 2011/0210807 A1 | 9/2011 | Sherrer |
| 2011/0273241 A1 | 11/2011 | Sherrer |
| 2012/0167033 A1 | 6/2012 | Cases |
| 2012/0182703 A1 | 7/2012 | Rendek, Jr. |
| 2012/0228014 A1* | 9/2012 | Das ........................ H05K 1/162 174/260 |
| 2012/0233849 A1 | 9/2012 | Smeys |
| 2013/0050055 A1 | 2/2013 | Paradiso |
| 2013/0127062 A1* | 5/2013 | Haba .................... H01L 23/492 257/773 |
| 2013/0127577 A1 | 5/2013 | Lotfi |
| 2013/0250520 A1* | 9/2013 | Taniguchi ............. H01L 23/045 361/707 |
| 2014/0210066 A1* | 7/2014 | Nagano ................... H01L 23/13 257/698 |
| 2014/0217570 A1* | 8/2014 | Hettler .................... H01L 23/64 257/690 |
| 2014/0252569 A1* | 9/2014 | Ikuma ..................... H01L 23/66 257/659 |
| 2016/0054385 A1 | 2/2016 | Suto |
| 2017/0040657 A1* | 2/2017 | Kocurek ................. H01P 3/081 |
| 2017/0229368 A1* | 8/2017 | Chiu ................... H01L 23/3675 |
| 2018/0333914 A1 | 11/2018 | Rudisill |
| 2019/0214179 A1 | 7/2019 | Pyrhönen |

FOREIGN PATENT DOCUMENTS

| | | |
|---|---|---|
| CN | 1261782 A | 8/2000 |
| CN | 1261782 | 6/2006 |
| DE | 3623093 A1 | 1/1988 |
| EP | 0398019 A1 | 11/1990 |
| EP | 0430593 A2 | 6/1991 |
| EP | 0448713 A1 | 10/1991 |
| EP | 0465230 A2 | 1/1992 |
| EP | 0485831 A1 | 5/1992 |
| EP | 0590393 A1 | 4/1994 |
| EP | 0689071 | 12/1995 |
| EP | 0845831 A2 | 6/1998 |
| EP | 0911111 A2 | 4/1999 |
| EP | 0911903 A2 | 4/1999 |
| EP | 1002612 A1 | 5/2000 |
| EP | 1061578 A1 | 12/2000 |
| EP | 1168021 A2 | 1/2002 |
| EP | 1321931 A2 | 6/2003 |
| EP | 1333267 A1 | 8/2003 |
| EP | 1515364 | 3/2005 |
| EP | 1729159 A1 | 12/2006 |
| FR | 2086327 A1 | 12/1971 |
| GB | 2136203 A | 9/1984 |
| GB | 2265754 | 10/1993 |
| GB | 2312551 A | 10/1997 |
| GB | 2419684 A | 5/2006 |
| JP | H027587 A | 1/1990 |
| JP | 2053007 | 2/1990 |
| JP | 3027587 | 2/1991 |
| JP | 4000782 | 1/1992 |
| JP | H041710 A | 1/1992 |
| JP | 06020930 | 1/1994 |
| JP | H0620930 A | 1/1994 |
| JP | H06020705 | 1/1994 |
| JP | H06020766 | 1/1994 |
| JP | H0685510 A | 3/1994 |
| JP | H06149483 A | 5/1994 |
| JP | H06302964 A | 10/1994 |
| JP | H07060844 | 3/1995 |
| JP | H07086693 | 3/1995 |
| JP | H07235803 | 9/1995 |
| JP | 06149483 | 1/1996 |
| JP | H10041710 A | 2/1998 |
| JP | 10170771 | 6/1998 |
| JP | 1998163711 | 6/1998 |
| JP | 1999086312 | 3/1999 |
| JP | H1186312 A | 3/1999 |
| JP | H11295560 A | 10/1999 |
| JP | 2000311961 | 11/2000 |
| JP | 2002510863 A | 4/2002 |
| JP | 2002176039 | 6/2002 |
| JP | 2002533954 | 10/2002 |
| JP | 2002341189 | 11/2002 |
| JP | 2002357743 | 12/2002 |
| JP | 2003032007 | 1/2003 |
| JP | 2003046014 | 2/2003 |
| JP | 2003078080 A | 3/2003 |
| JP | 2003249731 | 9/2003 |
| JP | 2005506701 A | 3/2005 |
| JP | 2005136384 A | 5/2005 |
| JP | 200667621 | 3/2006 |
| JP | 2006128683 A | 5/2006 |
| JP | 2007253354 | 10/2007 |
| JP | 2007305804 A | 11/2007 |
| JP | 2008211159 | 9/2008 |
| TW | I244799 | 12/2005 |
| WO | 9814813 A1 | 4/1998 |
| WO | 9827588 A1 | 6/1998 |
| WO | 1998027588 | 6/1998 |
| WO | 9950905 | 10/1999 |
| WO | 0007218 A2 | 2/2000 |
| WO | 0031771 A1 | 6/2000 |
| WO | 0039854 A1 | 7/2000 |
| WO | 0042464 | 7/2000 |
| WO | 0143181 A1 | 6/2001 |
| WO | 0206152 A2 | 1/2002 |
| WO | 02080279 A1 | 10/2002 |
| WO | 03034490 | 4/2003 |
| WO | 03046630 A1 | 6/2003 |
| WO | 03046640 A1 | 6/2003 |
| WO | 2004004061 | 1/2004 |
| WO | 2004025239 A2 | 3/2004 |
| WO | 2005112105 | 11/2005 |
| WO | 2006097842 A1 | 9/2006 |

(56) References Cited

FOREIGN PATENT DOCUMENTS

| | | |
|---|---|---|
| WO | 2009013751 A2 | 1/2009 |
| WO | 2010111455 | 9/2010 |

OTHER PUBLICATIONS

Chwomnawang et al., 'On-chip 3D Air Core Micro-Inductor for High-Frequency Applications Using Deformation of Sacrificial Polymer', Proc. SPIE, vol. 4334, pp. 54-62, Mar. 2001. NPL_2.

Elliott Brown/MEMGen Corporation, 'RF Applications of Efab Technology', MTT-S IMS 2003, pp. 1-15. NPL_6.

Engelmann et al., 'Fabrication of High Depth-to-Width Aspect Ratio Microstructures', IEEE Micro Electro Mechanical Systems (Feb. 1992), pp. 93-98.

European Search Report of Corresponding European Application No. 07 15 0467 dated Apr. 28, 2008.

Frazier et al., 'Metalic Microstructures Fabricated Using Photosensitive Polyimide Electroplating Molds', Journal of Microelectromechanical Systems, vol. 2, No. 2, Jun. 1993, pp. 87-94. NPL_8.

H. Guckel, 'High-Aspect-Ratio Micromachining Via Deep X-Ray Lithography', Proc. of IEEE, vol. 86, No. 8 (Aug. 1998), pp. 1586-1593. NPL_10.

Katehi et al., 'MEMS and Si Micromachined Circuits for High-Frequency Applications', IEEE Transactions on Microwave Theory and Techniques, vol. 50, No. 3, Mar. 2002, pp. 858-866. NPL_13.

Lee et al., 'Micromachining Applications of a High Resolution Ultrathick Photoresist', J. Vac. Sci. Technol. B 13 (6), Nov./Dec. 1995, pp. 3012-3016. NPL_15.

Loechel et al., 'Application of Ultraviolet Depth Lithography for Surface Micromachining', J. Vac. Sci. Technol. B 13 (6), Nov./Dec. 1995, pp. 2934-2939. NPL_16.

Park et al., 'Electroplated Micro-Inductors and Micro-Transformers for Wireless application', IMAPS 2002, Denver, CO, Sep. 2002. NPL_18.

Tummala et al.; 'Microelectronics Packaging Handbook'; Jan. 1, 1989; XP002477031; pp. 710-714. NPL_31.

Yoon et al., '3-D Lithography and Metal Surface Micromachining for RF and Microwave MEMs' IEEE MEMS 2002 Conference, Las Vegas, NV, Jan. 2002, pp. 673-676. NPL_21.

Yoon et al., 'CMOS-Compatible Surface Micromachined Suspended-Spiral Inductors for Multi-GHz Sillicon RF Ics', IEEE Electron Device Letters, vol. 23, No. 10, Oct. 2002, pp. 591-593. NPL_22.

Yoon et al., 'High-Performance Three-Dimensional On-Chip Inductors Fabricated by Novel Micromachining Technology for RF MMIC', 1999 IEEE MTT-S Int'l Microwave Symposium Digest, vol. 4, Jun. 13-19, 1999, Anaheim, California, pp. 1523-1526. NPL_24.

Yoon et al., 'Monolithic High-Q Overhang Inductors Fabricated on Silicon and Glass Substrates', International Electron Devices Meeting, Washington D.C. (Dec. 1999), pp. 753-756. NPL_25.

Yoon et al., 'Monolithic Integration of 3-D Electroplated Microstructures with Unlimited Number of Levels Using Planarization with a Sacrificial Metalic Mole (PSMm)', Twelfth IEEE Int'l Conf. on Micro Electro mechanical systems, Orlando Florida, Jan. 1999, pp. 624-629. NPL_26.

Yoon et al., 'Multilevel Microstructure Fabrication Using Single-Step 3D Photolithography and Single-Step Electroplating', Proc. of SPIE, vol. 3512, (Sep. 1998), pp. 358-366. NPL_27.

Filipovic et al.; 'Modeling, Design, Fabrication, and Performance of Rectangular .mu.-Coaxial Lines and Components'; Microwave Symposium Digest, 2006, IEEE; Jun. 1, 2006; pp. 1393-1396.

European Search Report of corresponding European Application No. 08 15 3138 dated Jul. 15, 2008.

Ali Darwish et al.; Vertical Balun and Wilkinson Divider; 2002 IEEE MTT-S Digest; pp. 109-112. NPL_30.

Cole, B.E., et al., Micromachined Pixel Arrays Integrated with CMOS for Infrared Applications, pp. 64-64 (2000). NPL_3.

De Los Santos, H.J., Introduction to Microelectromechanical (MEM) Microwave Systems {pp. 4, 7-8, 13) (1999). NPL_4.

Deyong, C, et al., A Microstructure Semiconductor Thermocouple for Microwave Power Sensors, 1997 Asia Pacific Microwave Conference, pp. 917-919. NPL_5.

Franssila, S., Introduction to Microfabrication, (pp. 8) (2004). NPL_7.

Ghodisian, B., et al., Fabrication of Affordable Metalic Microstructures by Electroplating and Photoresist Molds, 1996, pp. 68-71. NPL_9.

Hawkins, C.F., The Microelectronics Failure Analysis, Desk Reference Edition (2004). NPL_11.

Jeong, Inho et al., 'High-Performance Air-Gap Transmission Lines and Inductors for Millimeter-Wave Applications', IEEE Transactions on Microwave Theory and Techniques, Dec. 2002, pp. 2850-2855, vol. 50, No. 12. NPL_12.

Kenneth J. Vanhille et al.; Micro-Coaxial Impedance Transformers; Journal of Latex Class Files; vol. 6; No. 1; Jan. 2007. NPL_29.

Kwok, P.Y., et al., Fluid Effects in Vibrating Micromachined Structures, Journal of Microelectromechanical Systems, vol. 14, No. 4, Aug. 2005, pp. 770-781. NPL_14.

Madou, M.J., Fundamentals of Microfabrication: The Science of Miniaturization, 2d Ed., 2002 (Roadmap; pp. 615-668). NPL_17.

Sedky, S., Post-Processing Techniques for Integrated MEMS (pp. 9, 11, 164) (2006). NPL_19.

Yeh, J.L., et al., Copper-Encapsulated Silicon Micromachined Structures, Journal of Microelectromechanical Systems, vol. 9, No. 3, Sep. 2000, pp. 281-287. NPL_20.

Yoon et al., "High-Performance Electroplated Solenoid-Type Integrated Inductor (S12) for RF Applications Using Simple 3D Surface Micromachining Technology", Int'l Election Devices Meeting, 1998, San Francisco, CA, Dec. 6-9, 1998, pp. 544-547.

Chance, G.I. et al., "A suspended-membrane balanced frequency doubler at 200GHz," 29th International Conference on Infrared and Millimeter Waves and Terahertz Electronics, pp. 321-322, Karlsrube, 2004.

Colantonio, P., et al., "High Efficiency RF and Microwave Solid State Power Amplifiers," pp. 380-395, 2009.

Ehsan, N., "Broadband Microwave Litographic 3D Components," Doctoral Dissertation 2010.

Ehsan, N. et al., "Microcoaxial lines for active hybrid-monolithic circuits," 2009 IEEE MTT-S Int. Microwave.Symp. Boston, MA, Jun. 2009.

European Examination Report dated Mar. 21, 2013 for EP Application No. 07150463.3.

European Examination Report of corresponding European Patent Application No. 08 15 3144 dated Apr. 6, 2010.

European Examination Report of corresponding European Patent Application No. 08 15 3144 dated Feb. 22, 2012.

European Examination Report of corresponding European Patent Application No. 08 15 3144 dated Nov. 10, 2008.

European Search Report for corresponding EP Application No. 07150463.3 dated Apr. 23, 2012.

European Search Report of corresponding European Patent Application No. 08 15 3144 dated Jul. 2, 2008.

Filipovic, D. et al., "Monolithic rectangular coaxial lines. Components and systems for commercial and defense applications," Presented at 2008 IASTED Antennas, Radar, and Wave Propagation Conferences, Baltimore, MD, USA, Apr. 2008.

Filipovic, D.S., "Design of microfabricated rectangular coaxial lines and components for mm-wave applications," Microwave Review, vol. 12, No. 2, Nov. 2006, pp. 11-16.

Immorlica, Jr., T. et al., "Miniature 3D micro-machined solid state power amplifiers," COMCAS 2008.

Ingram, D.L. et al., "A 427 mW 20% compact W-band InP HEMT MMIC power amplifier," IEEE RFIC Symp. Digest 1999, pp. 95-98.

International Preliminary Report on Patentability dated Jul. 24, 2012 for corresponding PCT/US2011/022173.

International Preliminary Report on Patentability dated May 19, 2006 on corresponding PCT/US04/06665.

International Search Report dated Aug. 29, 2005 on corresponding PCT/US04/06665.

(56) References Cited

OTHER PUBLICATIONS

Jeong, I., et al., "High Performance Air-Gap Transmission Lines and Inductors for Milimeter-Wave Applications", Transactions on Microwave Theory and Techniques, vol. 50, No. 12, Dec. 2002.
Lukic, M. et al., "Surface-micromachined dual Ka-band cavity backed patch antennas," IEEE Trans. AtennasPropag., vol. 55, pp. 2107-2110, Jul. 2007.
Oliver, J.M. et al., "A 3-D micromachined W-band cavity backed patch antenna array with integrated rectacoax transition to wave guide," 2009 Proc. IEEE International Microwave Symposium, Boston, MA 2009.
PwrSoC Update 2012: Technology, Challenges, and Opportunities for Power Supply on Chip, Presentation (Mar. 18, 2013).
Rollin, J.M. et al., "A membrane planar diode for 200GHz mixing applications," 29th International Conference on Infrared and Millimeter Waves and Terahertz Electronics, pp. 205-206, Karlsrube, 2004.
Rollin, J.M. et al., "Integrated Schottky diode for a sub-harmonic mixer at millimetre wavelengths," 31st International Conference on Infrared and Millimeter Waves and Terahertz Electronics, Paris, 2006.
Saito, Y., Fontaine, D., Rollin, J-M., Filipovic, D., 'Micro-Coaxial Ka-Band Gysel Power Dividers,' Microwave Opt Technol Lett 52: 474-478, 2010, Feb. 2010.
Saito et al., "Analysis and design of monolithic rectangular coaxial lines for minimum coupling," IEEE Trans. Microwave Theory Tech., vol. 55, pp. 2521-2530, Dec. 2007.
Sherrer, D, Vanhille, K, Rollin, J.M., 'PolyStrata Technology: A Disruptive Approach for 3D Microwave Components and Modules,' Presentation (Apr. 23, 2010).
Vanhille, K., 'Design and Characterization of Microfabricated Three-Dimensional Millimeter-Wave Components,' Dissertation, 2007.
Vanhille, K. et al., 'Balanced low-loss Ka-band-coaxial hybrids,' IEEE MTT-S Dig., Honolulu, Hawaii, Jun. 2007.
Vanhille, K. et al., "Ka-Band surface mount directional coupler fabricated using micro-rectangular coaxial transmission lines," 2008 Proc. IEEE International Microwave Symposium, 2008.
Vanhille, K.J. et al., "Ka-band miniaturized quasi-planar high-Q resonators," IEEE Trans. Microwave Theory Tech., vol. 55, No. 6, pp. 1272-1279, Jun. 2007.
Vyas R. et al., "Liquid Crystal Polymer (LCP): The ultimate solution for low-cost RF flexible electronics and antennas," Antennas and Propagation Society, International Symposium, p. 1729-1732 (2007).
Wang, H. et al., "Design of a low integrated sub-harmonic mixer at 183GHz using European Schottky diode technology," From Proceedings of the 4th ESA workshop on Millimetre-Wave Technology and Applications, pp. 249-252, Espoo, Finland, Feb. 2006.
Wang, H. et al., "Power-amplifier modules covering 70-113 GHz using MMICs," IEEE Trans Microwave Theory and Tech., vol. 39, pp. 9-16, Jan. 2001.
Written Opinion of the International Searching Authority dated Aug. 29, 2005 on corresponding PCT/US04/06665.
"Multiplexer/LNA Module using PolyStrata®," GOMACTech-15, Mar. 26, 2015.
"Shiffman phase shifters designed to work over a 15-45GHz range," phys.org, Mar. 2014. [online: http://phys.org/wire-news/156496085/schiffman-phase-shifters-designed-to-work-over-a-15-45ghz-range.html].
A. Boryssenko, J. Arroyo, R. Reid, M.S. Heimbeck, "Substrate free G-band Vivaldi antenna array design, fabrication and testing" 2014 IEEE International Conference on Infrared, Millimeter, and Terahertz Waves, Tucson, Sep. 2014.
A. Boryssenko, K. Vanhille, "300-GHz microfabricated waveguide slotted arrays" 2014 IEEE International Conference on Infrared, Millimeter, and Terahertz Waves, Tucson, Sep. 2014.
A.A. Immorlica Jr., R. Actis, D. Nair, K. Vanhille, C. Nichols, J.-M. Rollin, D. Fleming, R. Varghese, D. Sherrer, D. Filipovic, E. Cullens, N. Ehsan, and Z. Popovic, "Miniature 3D micromachined solid state amplifiers," in 2008 IEEE International Conference on Microwaves, Communications, Antennas, and Electronic Systems, Tel-Aviv, Israel, May 2008, pp. 1-7.
B. Cannon, K. Vanhille, "Microfabricated Dual-Polarized, W-band Antenna Architecture for Scalable Line Array Feed," 2015 IEEE Antenna and Propagation Symposium, Vancouver, Canada, Jul. 2015.
D. Filipovic, G. Potvin, D. Fontaine, C. Nichols, Z. Popovic, S. Rondineau, M. Lukic, K. Vanhille, Y. Saito, D. Sherrer, W. Wilkins, E. Daniels, E. Adler, and J. Evans, "Integrated micro-coaxial Ka-band antenna and array," GomacTech 2007 Conference, Mar. 2007.
D. Filipovic, G. Potvin, D. Fontaine, Y. Saito, J.-M. Rollin, Z. Popovic, M. Lukic, K. Vanhille, C. Nichols, "µ-coaxial phased arrays for Ka-Band Communications," Antenna Applications Symposium, Monticello, IL, Sep. 2008, pp. 104-115.
D. Filipovic, Z. Popovic, K. Vanhille, M. Lukic, S. Rondineau, M. Buck, G. Potvin, D. Fontaine, C. Nichols, D. Sherrer, S. Zhou, W. Houck, D. Fleming, E. Daniel, W. Wilkins, V. Sokolov, E. Adler, and J. Evans, "Quasi-planar rectangular µ-coaxial structures for mm-wave applications," Proc. GomacTech., pp. 28-31, San Diego, Mar. 2006.
D. Sherrer, "Improving electronics' functional density," MICROmanufacturing, May/Jun. 2015, pp. 16-18.
D.S. Filipovic, M. Lukic, Y. Lee and D. Fontaine, "Monolithic rectangular coaxial lines and resonators with embedded dielectric support," IEEE Microwave and Wireless Components Letters, vol. 18, No. 11, pp. 740-742, 2008.
E. Cullens, "Microfabricated Broadband Components for Microwave Front Ends," Thesis, 2011.
E. Cullens, K. Vanhille, Z. Popovic, "Miniature bias-tee networks integrated in microcoaxial lines," in Proc. 40th European Microwave Conf., Paris, France, Sep. 2010, pp. 413-416.
E. Cullens, L. Ranzani, E. Grossman, Z. Popovic, "G-Band Frequency Steering Antenna Array Design and Measurements," Proceedings of the XXXth URSI General Assembly, Istanbul, Turkey, Aug. 2011.
E. Cullens, L. Ranzani, K. Vanhille, E. Grossman, N. Ehsan, Z. Popovic, "Micro-Fabricated 130-180 GHz frequency scanning waveguide arrays," IEEE Trans. Antennas Propag., Aug. 2012, vol. 60, No. 8, pp. 3647-3653.
European Examination Report of EP App. No. 07150463.3 dated Feb. 16, 2015.
Extended EP Search Report for Ep Application No. 12811132.5 dated Feb. 5, 2016.
H. Kazemi, "350mW G-band Medium Power Amplifier Fabricated Through a New Method of 3D-Copper Additive Manufacturing," IEEE 2015.
H. Kazemi, "Ultra-compact G-band 16way Power Splitter/Combiner Module Fabricated Through a New Method of 3D-Copper Additive Manufacturing," IEEE 2015.
H. Zhou, N. A. Sutton, D. S. Filipovic, "Surface micromachined millimeter-wave log-periodic dipole array antennas," IEEE Trans. Antennas Propag., Oct. 2012, vol. 60, No. 10, pp. 4573-4581.
H. Zhou, N. A. Sutton, D. S. Filipovic, "Wideband W-band patch antenna," 5th European Conference on Antennas and Propagation, Rome, Italy, Apr. 2011, pp. 1518-1521.
H. Zhou, N.A. Sutton, D. S. Filipovic, "W-band endfire log periodic dipole array," Proc. IEEE-APS/URSI Symposium, Spokane, WA, Jul. 2011, pp. 1233-1236.
Horton, M.C., et al., "The Digital Elliptic Filter—A Compact Sharp-Cutoff Design for Wide Bandstop or Bandpass Requirements," IEEE Transactions on Microwave Theory and Techniques, (1967) MTT-15:307-314.
International Search Report and Written Opinion for PCT/US2015/063192 dated May 20, 2016.
International Search Report corresponding to PCT/US12/46734 dated Nov. 20, 2012.
J. M. Oliver, J.-M. Rollin, K. Vanhille, S. Raman, "A W-band micromachined 3-D cavity-backed patch antenna array with integrated diode detector," IEEE Trans. Microwave Theory Tech., Feb. 2012, vol. 60, No. 2, pp. 284-292.
J. M. Oliver, P. E. Ralston, E. Cullens, L. M. Ranzani, S. Raman, K. Vanhille, "A W-band Micro-coaxial Passive Monopulse Comparator

(56) References Cited

OTHER PUBLICATIONS

Network with Integrated Cavity—Backed Patch Antenna Array," 2011 IEEE MTT-S Int. Microwave, Symp., Baltimore, MD, Jun. 2011.

J. Mruk, "Wideband Monolithically Integrated Front-End Subsystems and Components," Thesis, 2011.

J. Mruk, Z. Hongyu, M. Uhm, Y. Saito, D. Filipovic, "Wideband mm-Wave Log-Periodic Antennas," 3rd European Conference on Antennas and Propagation, pp. 2284-2287, Mar. 2009.

J. Oliver, "3D Micromachined Passive Components and Active Circuit Integration for Millimeter-Wave Radar Applications," Thesis, Feb. 10, 2011.

J. R. Mruk, H. Zhou, H. Levitt, D. Filipovic, "Dual wideband monolithically integrated millimeter-wave passive front-end subsystems," in 2010 Int. Conf. on Infrared, Millimeter and Terahertz Waves, Sep. 2010, pp. 1-2.

J. R. Mruk, N. Sutton, D. S. Filipovic, "Micro-coaxial fed 18 to 110 GHz planar log-periodic antennas with RF transitions," IEEE Trans. Antennas Propag., vol. 62, No. 2, Feb. 2014, pp. 968-972.

J. Reid, "PolyStrata Millimeter-wave Tunable Filters," GOMACTech-12, Mar. 22, 2012.

J.M. Oliver, H. Kazemi, J.-M. Rollin, D. Sherrer, S. Huettner, S. Raman, "Compact, low-loss, micromachined rectangular coaxial millimeter-wave power combining networks," 2013 IEEE MTT-S Int. Microwave, Symp., Seattle, WA, Jun. 2013.

J.R. Mruk, Y. Saito, K. Kim, M. Radway, D. Filipovic, "A directly fed Ku- to W-band 2-arm Archimedean spiral antenna," Proc. 41st European Microwave Conf., Oct. 2011, pp. 539-542.

J.R. Reid, D. Hanna, R.T. Webster, "A 40/50 GHz diplexer realized with three dimensional copper micromachining," in 2008 IEEE MTT-S Int. Microwave Symp., Atlanta, GA, Jun. 2008, pp. 1271-1274.

J.R. Reid, J.M. Oliver, K. Vanhille, D. Sherrer, "Three dimensional metal micromachining: A disruptive technology for millimeter-wave filters," 2012 IEEE Topical Meeting on Silicon Monolithic Integrated Circuits in RF Systems, Jan. 2012.

K. J. Vanhille, D. L. Fontaine, C. Nichols, D. S. Filipovic, and Z. Popovic, "Quasi-planar high-Q millimeter-wave resonators," IEEE Trans. Microwave Theory Tech., vol. 54, No. 6, pp. 2439-2446, Jun. 2006.

K. M. Lambert, F. A. Miranda, R. R. Romanofsky, T. E. Durham, K. J. Vanhille, "Antenna characterization for the Wideband Instrument for Snow Measurements (WISM)," 2015 IEEE Antenna and Propagation Symposium, Vancouver, Canada, Jul. 2015.

K. Vanhille, "Design and Characterization of Microfabricated Three-Dimensional Millimeter-Wave Components," Thesis, 2007.

K. Vanhille, M. Buck, Z. Popovic, and D.S. Filipovic, "Miniature Ka-band recta-coax components: analysis and design," presented at 2005 AP-S/URSI Symposium, Washington, DC, Jul. 2005.

K. Vanhille, M. Lukic, S. Rondineau, D. Filipovic, and Z. Popovic, "Integrated micro-coaxial passive components for millimeter-wave antenna front ends," 2007 Antennas, Radar, and Wave Propagation Conference, May 2007.

K. Vanhille, T. Durham, W. Stacy, D. Karasiewicz, A. Caba, C. Trent, K. Lambert, F. Miranda, "A microfabricated 8-40 GHz dual-polarized reflector feed," 2014 Antenna Applications Symposium, Monticello, IL, Sep. 2014. pp. 241-257.

L. Ranzani, D. Kuester, K. J. Vanhille, A Boryssenko, E. Grossman, Z. Popovic, "G-Band microfabricated frequency-steered arrays with 2 degree /GHz beam steering," IEEE Trans. on Terahertz Science and Technology, vol. 3, No. 5, Sep. 2013.

L. Ranzani, E. D. Cullens, D. Kuester, K. J. Vanhille, E. Grossman, Z. Popovic, "W-band micro-fabricated coaxially-fed frequency scanned slot arrays," IEEE Trans. Antennas Propag., vol. 61, No. 4, Apr. 2013.

L. Ranzani, I. Ramos, Z. Popovic, D. Maksimovic, "Microfabricated transmission-line transformers with DC isolation," URSI National Radio Science Meeting, Boulder, CO, Jan. 2014.

L. Ranzani, N. Ehsan, Z. Popovic, "G-band frequency-scanned antenna arrays," 2010 IEEE APS-URSI International Symposium, Toronto, Canada, Jul. 2010.

M. Lukic, D. Filipovic, "Modeling of surface roughness effects on the performance of rectangular μ-coaxial lines," Proc. 22nd Ann. Rev. Prog. Applied Comp. Electromag. (ACES), pp. 620-625, Miami, Mar. 2006.

M. Lukic, D. Fontaine, C. Nichols, D. Filipovic, "Surface micromachined Ka-band phased array antenna," Presented at Antenna Applic. Symposium, Monticello, IL, Sep. 2006.

M. Lukic, K. Kim, Y. Lee, Y. Saito, and D. S. Filipovic, "Multi-physics design and performance of a surface micromachined Ka-band cavity backed patch antenna," 2007 SBMO/IEEE Int. Microwave and Optoelectronics Conf., Oct. 2007, pp. 321-324.

M. Lukic, S. Rondineau, Z. Popovic, D. Filipovic, "Modeling of realistic rectangular μ-coaxial lines," IEEE Trans. Microwave Theory Tech., vol. 54, No. 5, pp. 2068-2076, May 2006.

M. V. Lukic, and D. S. Filipovic, "Integrated cavity-backed ka-band phased array antenna," Proc. IEEE-APS/URSI Symposium, Jun. 2007, pp. 133-135.

M. V. Lukic, and D. S. Filipovic, "Modeling of 3-D Surface Roughness Effects With Application to μ-Coaxial Lines," IEEE Trans. Microwave Theory Tech., Mar. 2007, pp. 518-525.

M. V. Lukic, and D. S. Filipovic, "Surface-micromachined dual Ka-band cavity backed patch antenna," IEEE Trans. Antennas Propag., vol. 55, No. 7, pp. 2107-2110, Jul. 2007.

Mruk, J.R., Filipovic, D.S, "Micro-coaxial V-/W-band filters and contiguous diplexers," Microwaves, Antennas & Propagation, IET, Jul. 17 2012, vol. 6, issue 10, pp. 1142-1148.

Mruk, J.R., Saito, Y., Kim, K., Radway, M., Filipovic, D.S., "Directly fed millimetre-wave two-arm spiral antenna," Electronics Letters, Nov. 25 2010, vol. 46, issue 24, pp. 1585-1587.

N. Chamberlain, M. Sanchez Barbetty, G. Sadowy, E. Long, K. Vanhille, "A dual-polarized metal patch antenna element for phased array applications," 2014 IEEE Antenna and Propagation Symposium, Memphis, Jul. 2014. pp. 1640-1641.

N. Ehsan, "Broadband Microwave Lithographic 3D Components," Thesis, 2009.

N. Ehsan, K. Vanhille, S. Rondineau, E. Cullens, Z. Popovic, "Broadband Micro-Coaxial Wilkinson Dividers," IEEE Trans. Microwave Theory Tech., Nov. 2009, pp. 2783-2789.

N. Ehsan, K.J. Vanhille, S. Rondineau, Z. Popovic, "Micro-coaxial impedance transformers," IEEE Trans. Microwave Theory Tech., Nov. 2010, pp. 2908-2914.

N. Jastram, "Design of a Wideband Millimeter Wave Micromachined Rotman Lens," IEEE Transactions on Antennas and Propagation, vol. 63, No. 6, Jun. 2015.

N. Jastram, "Wideband Millimeter-Wave Surface Micromachined Tapered Slot Antenna," IEEE Antennas and Wireless Propagation Letters, vol. 13, 2014.

N. Jastram, "Wideband Multibeam Millimeter Wave Arrays," IEEE 2014.

N. Jastram, D. Filipovic, "Monolithically integrated K/Ka array-based direction finding subsystem," Proc. IEEE-APS/URSI Symposium, Chicago, IL, Jul. 2012, pp. 1-2.

N. Jastram, D. S. Filipovic, "Parameter study and design of W-band micromachined tapered slot antenna," Proc. IEEE-APS/URSI Symposium, Orlando, FL, Jul. 2013, pp. 434-435.

N. Jastram, D. S. Filipovic, "PCB-based prototyping of 3-D micromachined RF subsystems," IEEE Trans. Antennas Propag., vol. 62, No. 1, Jan. 2014. pp. 420-429.

N. Sutton, D.S. Filipovic, "Design of a K- thru Ka-band modified Butler matrix feed for a 4-arm spiral antenna," 2010 Loughborough Antennas and Propagation Conference, Loughborough, UK, Nov. 2010, pp. 521-524.

N.A. Sutton, D. S. Filipovic, "V-band monolithically integrated four-arm spiral antenna and beamforming network," Proc. IEEE-APS/URSI Symposium, Chicago, IL, Jul. 2012, pp. 1-2.

N.A. Sutton, J. M. Oliver, D. S. Filipovic, "Wideband 15-50 GHz symmetric multi-section coupled line quadrature hybrid based on surface micromachining technology," 2012 IEEE MTT-S Int. Microwave, Symp., Montreal, Canada, Jun. 2012.

(56) References Cited

OTHER PUBLICATIONS

N.A. Sutton, J.M. Oliver, D.S. Filipovic, "Wideband 18-40 GHz surface micromachined branchline quadrature hybrid," IEEE Microwave and Wireless Components Letters, Sep. 2012, vol. 22, No. 9, pp. 462-464.
P. Ralston, K. Vanhille, A. Caba, M. Oliver, S. Raman, "Test and verification of micro coaxial line power performance," 2012 IEEE MTT-S Int. Microwave, Symp., Montreal, Canada, Jun. 2012.
P. Ralston, M. Oliver, K. Vummidi, S. Raman, "Liquid-metal vertical interconnects for flip chip assembly of GaAs C-band power amplifiers onto micro-rectangular coaxial transmission lines," IEEE Compound Semiconductor Integrated Circuit Symposium, Oct. 2011.
P. Ralston, M. Oliver, K. Vummidi, S. Raman, "Liquid-metal vertical interconnects for flip chip assembly of GaAs C-band power amplifiers onto micro-rectangular coaxial transmission lines," IEEE Journal of Solid-State Circuits, Oct. 2012, vol. 47, No. 10, pp. 2327-2334.
S. Huettner, "High Performance 3D Micro-Coax Technology," Microwave Journal, Nov. 2013. [online: http://www.microwavejournal.com/articles/21004-high-performance-3d-micro-coax-technology].
S. Huettner, "Transmission lines withstand vibration," Microwaves and RF, Mar. 2011. [online: http://mwrf.com/passive-components/transmission-lines-withstand-vibration].
S. Scholl, C. Gorle, F. Houshmand, T. Liu, H. Lee, Y. Won, H. Kazemi, M. Asheghi, K. Goodson, "Numerical Simulation of Advanced Monolithic Microcooler Designs for High Heat Flux Microelectronics," InterPACK, San Francisco, CA, Jul. 2015.
T. Durham, H.P. Marshall, L. Tsang, P. Racette, Q. Bonds, F. Miranda, K. Vanhille, "Wideband sensor technologies for measuring surface snow," Earthzine, Dec. 2013, [online: http://www.earthzine.org/2013/12/02/wideband-sensor-technologies-for-measuring-surface-snow/].
T. E. Durham, C. Trent, K. Vanhille, K. M. Lambert, F. A. Miranda, "Design of an 8-40 GHz Antenna for the Wideband Instrument for Snow Measurements (WISM)," 2015 IEEE Antenna and Propagation Symposium, Vancouver, Canada, Jul. 2015.
T. Liu, F. Houshmand, C. Gorle, S. Scholl, H. Lee, Y. Won, H. Kazemi, K. Vanhille, M. Asheghi, K. Goodson, "Full-Scale Simulation of an Integrated Monolithic Heat Sink for Thermal Management of a High Power Density GaN-SiC Chip," InterPACK/ICNMM, San Francisco, CA, Jul. 2015.
T.E. Durham, "An 8-40GHz Wideband Instrument for Snow Measurements," Earth Science Technology Forum, Pasadena, CA, Jun. 2011.
Written Opinion corresponding to PCT/US12/46734 dated Nov. 20, 2012.
Y. Saito, D. Fontaine, J.-M. Rollin, D.S. Filipovic, "Monolithic micro-coaxial power dividers," Electronic Letts., Apr. 2009, pp. 469-470.
Y. Saito, J.R. Mruk, J.-M. Rollin, D.S. Filipovic, "X- through Q-band log-periodic antenna with monolithically integrated u-coaxial impedance transformer/feeder," Electronic Letts. Jul. 2009, pp. 775-776.
Y. Saito, M.V. Lukic, D. Fontaine, J.-M. Rollin, D.S. Filipovic, "Monolithically Integrated Corporate-Fed Cavity-Backed Antennas," IEEE Trans. Antennas Propag., vol. 57, No. 9, Sep. 2009, pp. 2583-2590.
Z. Popovic, "Micro-coaxial micro-fabricated feeds for phased array antennas," in IEEE Int. Symp. on Phased Array Systems and Technology, Waltham, MA, Oct. 2010, pp. 1-10. (Invited).
Z. Popovic, K. Vanhille, N. Ehsan, E. Cullens, Y. Saito, J.-M. Rollin, C. Nichols, D. Sherrer, D. Fontaine, D. Filipovic, "Micro-fabricated micro-coaxial millimeter-wave components," in 2008 Int. Conf. on Infrared, Millimeter and Terahertz Waves, Pasadena, CA, Sep. 2008, pp. 1-3.
Z. Popovic, S. Rondineau, D. Filipovic, D. Sherrer, C. Nichols, J.-M. Rollin, and K. Vanhille, "An enabling new 3D architecture for microwave components and systems," Microwave Journal, Feb. 2008, pp. 66-86.
International Search Report and Written Opinion for PCT/US2015/011789 dated Apr. 10, 2015.
Derwent Abstract Translation of WO-2010-011911 A2 (published 2010).
Tian, et al.; Fabrication of multilayered SU8 structure for terahertz waveguide with ultralow transmission loss; Aug. 18, 2013; Dec. 10 -2013; pp. 13002-1 to 13002-6.
Communication dated Jun. 24, 2011 in the corresponding European Patent Application No. 08151799.7.
European Search Report of corresponding European Application No. EP 08 15 1799 dated Jun. 6, 2008.
European Search Report of corresponding European Application No. 04255517.7-2203.
Kutchovkov et al., "New Fabrication Technology for Wafer-Through Hole Interconnects", Proceed. SeSens 2001, pp. 813-817.
Linder et al., 'Fabrication Technology for Wafer Through-Hole Interconnections and Three-Dimensional Stacks of Chips and Wafers', IEEE, 1994, pp. 349-354.
Nguyen et al., 'Through-Wafer Copper Electroplating for Three Dimensional Interconnects', J. Micromech, Microeng. 12 (2002) pp. 395-399.
Ok et al., 'High Density, High Aspect Ratio Through-Wafer Electrical Interconnect Vias for MEMS Packaging', IEEE Transactions of Advanced Packaging, vol. 26, No. 3, Aug. 2003, pp. 302-309.
Pham et al., 'A Novel Micromachining Process Using Pattern Transfer Over Large Topography for RF Silicon Technology', Proceedings of the SAFE/IEEE workshop, Nov. 2000, pp. 125-128.
Rasmussen et al., 'Batch Fabrication of Through-Wafer Vias in CMOS Wafers for 3-D Packaging Applications', IEEE, 2003 Electronic Components and Technology Conference, pp. 634-639.
Rosen et al., 'Membrane Covered Electrically Isolated Through-Wafer Via Holes', J. Microetch, Microeng. 11 (2001), pp. 344-347.
Lee et al., 'Au—In Bonding Below the Eutectic Temperature', IEEE Transactions on Components, Hybrids and Manufacturing Technology, vol. 16, No. 3, May 1993, pp. 311-316.
Lee et al., 'High Temperature Tin-Cooper Joints at Low Process Temperature for Stress Reduction', Thin solid Films 286 (1996), pp. 213-218.
Lee et al., "Advances in Bonding Technology for Electronic Packaging", Journal of Electronic Packaging, vol. 115, Jun. 1993, pp. 201-207.
Lee et al., "High Temperature Silver-Indium Joints Manufactured at Low Temperature", Thin Solid Films 366 (2000), pp. 196-201.
European Search Report of European Application No. 04255516.9 dated Apr. 26, 2005.
Patent Invalidation Search, Nuvotronics, LLC, Aug. 18, 2011, pp. 1-31.
Official Action dated Mar. 27, 2015 in corresponding Canadian Application No. 2,884,972.

* cited by examiner

INTEGRATED CHIP SCALE PACKAGES

RELATED APPLICATIONS

This is a continuation application of U.S. application Ser. No. 15/829,288, filed Dec. 1, 2017, issued as U.S. Pat. No. 10,319,654 on Jun. 11, 2019, the entire contents of which application(s) are incorporated herein by reference.

FIELD OF THE INVENTION

The present invention relates generally to a chip scale package and more particularly but not exclusively to a chip scale package having a chip integrated therein to provide an integrated chip scale package.

BACKGROUND OF THE INVENTION

Current industry approaches to packaging integrated circuits have key deficiencies: first, the packaging approaches currently available are not able to produce passive circuits such as combiners or filters with performance suitable for modern communication systems; and second, these packaging processes result in significant size growth of the chips in all three dimensions. In a typical package, it is necessary for the package to have at least a 1 mm region around the chip in the planar dimensions. In addition, packages with a physical height less than 0.5 mm are difficult to achieve, particularly for parts that require an air cavity above the chip. As a result a semiconductor chip that is 1×1.5 mm in the planar direction and 0.1 mm thick will grow to a packaged part that is at least 3×3.5×0.5 mm, a volume increase of 35× from the bare chip to the packaged chip. This volume can be a key driver in systems such as phased arrays. For example, a 30 GHz phased array with half wavelength element pitch provides a total area of 5×5 mm for each element. While the third axis out of the 5×5 mm plane is not confined, fitting all required parts into the element pitch is a key driver for being able to use a tile based approach in implementing the array. The new approach detailed in the present disclosure solves both of these problems, while also providing improved input/output insertion loss and superior ability to stack packaged parts in the vertical axis.

SUMMARY OF THE INVENTION

In one of its aspects the present invention may provide a packaging approach for enclosing an integrated circuit chip and/or other electronic/Poly Strata® components inside of a package carrier formed by PolyStrata® additive sequential layer build technology. As used herein the examples of the PolyStrata® additive sequential layer build technology by Nuvotronics, Inc. may be found in U.S. Pat. Nos. 7,012,489, 7,148,772, 7,405,638, 7,948,335, 7,649,432, 7,656,256, 8,031,037, 7,755,174, and 7,898,356, the contents of which patents are incorporated herein by reference. The PolyStrata® build technology may be of interest in that it enables a chip to be protected per industry best practices, while also minimizing the size and overhead resulting from more traditional packaging of integrated circuit chips. By directly packaging the chip in a PolyStrata® fabricated carrier, it is possible to create larger integrated modules or systems that contain one or more heterogeneous integrated circuits. The approach detailed here offers physically small package overhead, exceptional performance up to millimeter wave frequencies, and tight coupling between integrated circuits and high performance microwave/millimeter wave passive circuits fabricated using PolyStrata® sequential layer build technology. The PolyStrata® build technology also offers a higher level of performance for transmission lines, filters, couplers, and combiners than either ceramic or soft-board technologies.

In some of its aspects the present invention may address several key challenges and provide a number of advantages. For instance, the present invention may provide higher frequency RF performance, simplified packaging hermeticity, and improved packaging density, such as for wideband and/or millimeter wave phased arrays. For example, a 30 Ghz phased array has an array pitch less than 5 mm, which generally necessitates the use of a slat architecture due to the sizing required for the chip package. Further, when integrated into an active Poly Strata® module (APM), it is possible to connect parts together both vertically and horizontally. As a result, devices and structures of the present invention may leverage a small scale packaging advantage of PolyStrata® sequential layer build technology to create direct high frequency coupling between devices internal to the package with a standard JEDEC external packaging interconnection. This enables high performance coupling to other types of host level packaging. RF interconnects up to 100 GHz with very low insertion loss (less than 0.1 dB) and excellent match (RL better than 20 dB) be designed for most standard interconnects. Full or partial array interconnection which increases package density, shorter RF and DC paths, and higher frequency performance may be provided.

Accordingly, in one of its aspects the present invention may provide a chip scale package, comprising a carrier composed of a plurality of sequential layers stacked together as a continuous stack to provide a monolithic carrier body. The continuous stack may include metal. The carrier may include at a selected surface thereof a passageway extending between the exterior and interior of the carrier. The passageway may include a conductive stub extending therethrough, with the stub suspended in the passageway by a dielectric support. The stub and support may cooperate to create a hermetic, or at least partially hermetic, seal at the passageway between the exterior and interior of the carrier. The conductive stub may include a plurality of sequential layers stacked together as a continuous stack. The dielectric support may include a first portion embedded in the conductive stub, and/or may include a second portion embedded in the carrier at the passageway. The dielectric support may include an annular disk and have a shape such as a washer. An electronic chip and/or die may be disposed in the carrier and be electrically connected to the stub. The electronic chip and/or die may be electrically connected to the stub by a wirebond, a solder bump, conductive epoxy, or by other traditional electronic assembly means.

In addition, the chip scale package may include a coaxial connector mounted thereto, and the coaxial connector may include a center conductor electrically connected to the conductive stub and an outer conductor electrically connected to the carrier body. The chip scale package may include a plurality of passageways extending between the exterior and interior of the carrier, the passageways each having a respective conductive stub extending therethrough, each stub suspended in the respective passageway by a dielectric support, each stub and respective support cooperating to create a hermetic seal at the respective passageway between the exterior and interior of the carrier.

BRIEF DESCRIPTION OF THE DRAWINGS

The foregoing summary and the following detailed description of exemplary embodiments of the present invention may be further understood when read in conjunction with the appended drawings, in which.

DETAILED DESCRIPTION OF THE INVENTION

Figure 3:
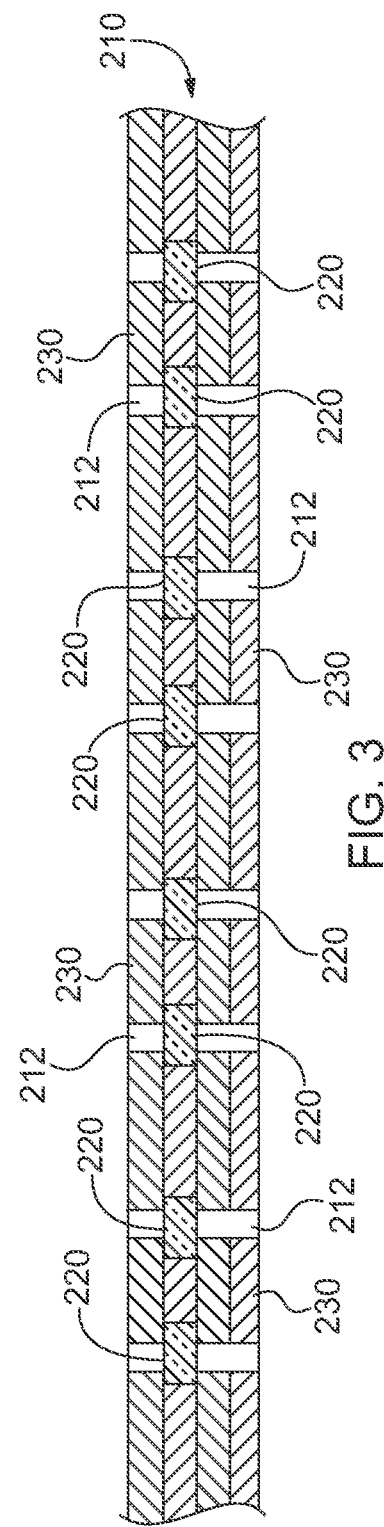
FIG. 3 schematically illustrates a fragmentary side cross-sectional view of an exemplary device structure in accordance with the present invention showing multiple vias having dielectric collars to provide a hermetic seal.
Figure 4:
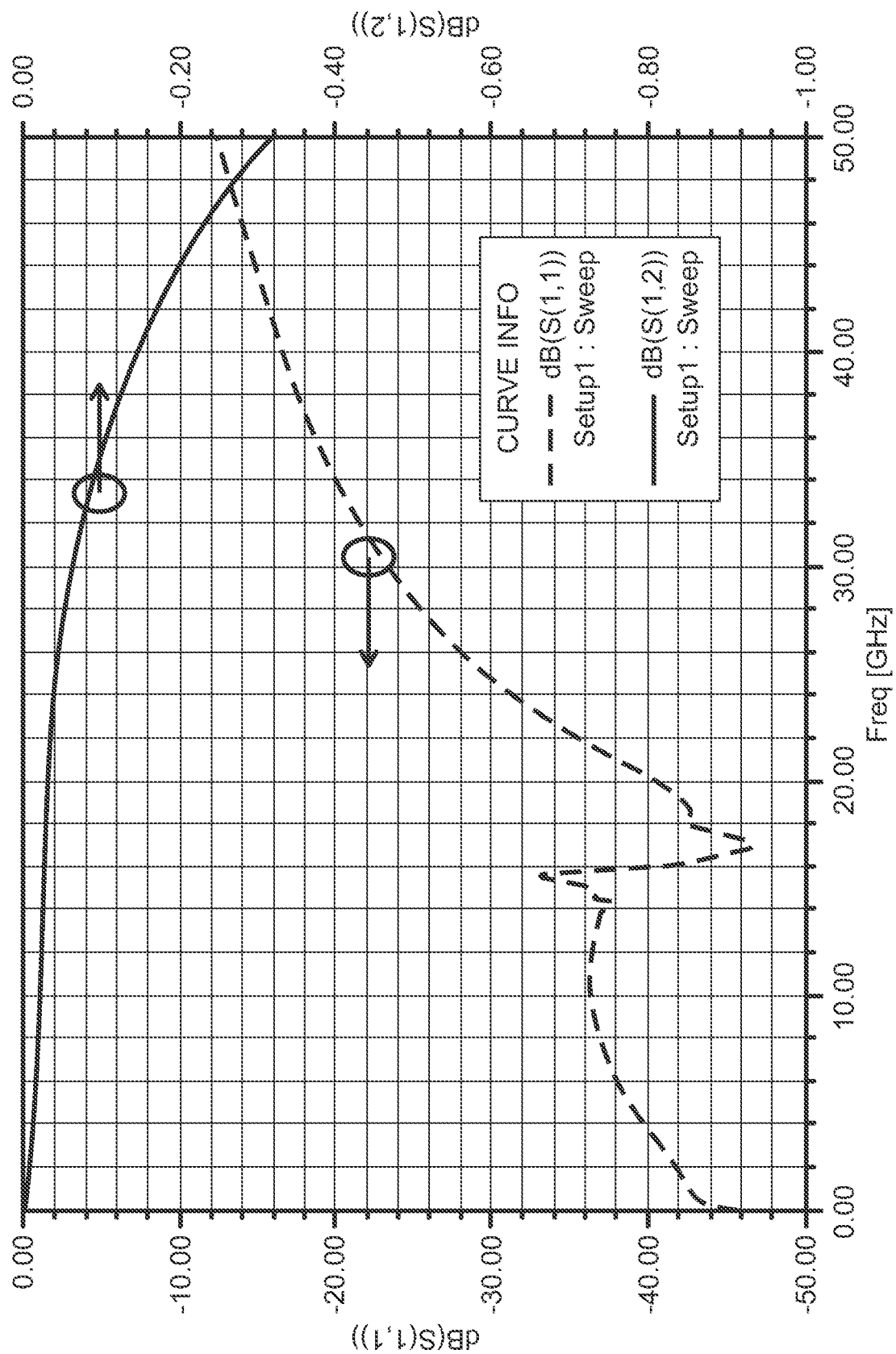
FIG. 4 illustrates the simulated insertion loss and return loss of from the package into the chip for a package as configured in FIG. 1.

Referring now to the figures, wherein like elements are numbered alike throughout, FIGS. 1A-1D schematically illustrate an exemplary integrated chip scale package 100 in accordance with the present invention having a carrier 110 with a chip 140 integrally mounted therein with the carrier 110 sealed by a lid 160. The carrier 110 may include a plurality of layers of a material, such as a metal, which may be laid down as a plurality of sequentially deposited layers using PolyStrata® sequential layer build technology. The carrier may include one or more apertures 112 disposed at a selected surface thereof, the apertures 112 extending through a wall of the carrier to permit communication between, or pass power between, the interior and exterior of the carrier 110. One or more conductive stubs 130 may be provided in each aperture 112 to permit electrical communication between the interior and exterior of the carrier 110 and package 100. The conductive stubs 130 may be suspended within the apertures 112 by insulative dielectric materials 120 to prevent direct contact with, and prevent electrical communication between, the conductive stubs 130 and the carrier 110 in the region of the apertures 112. (A multiplicity of conductive stubs 230 may be suspended within the apertures of a carrier 210 by insulative dielectric materials 220, FIG. 3.) The conductive stubs 130 may include a plurality of sequentially deposited layers using Poly Strata® sequential layer build technology. The dielectric material 120 may also be provided as part of the PolyStrata® sequential layer build process. The dielectric material 120 may include a ceramic material such as alumina, or a glass such as Corning 7070 or 3D photo imaged glass. The dielectric material 120 may be kept thin in a range from 50 to 75 micrometers in height.

The dielectric material 120 may be provided in the form of an annular disk, such as in the shape of a washer, where the outer periphery of the dielectric material 120 may be embedded in the carrier 110 and the inner portion of the dielectric material 120 may be embedded in the conductive stubs 130. Thus, the dielectric materials 120 may be structured and positioned to provide a hermetic seal about the conductive stubs 130, in turn hermetically sealing the apertures 112. With the addition of a lid 160 to the carrier 110, a hermetically sealed integrated chip scale package 100 may be provided.

Figure 1A:
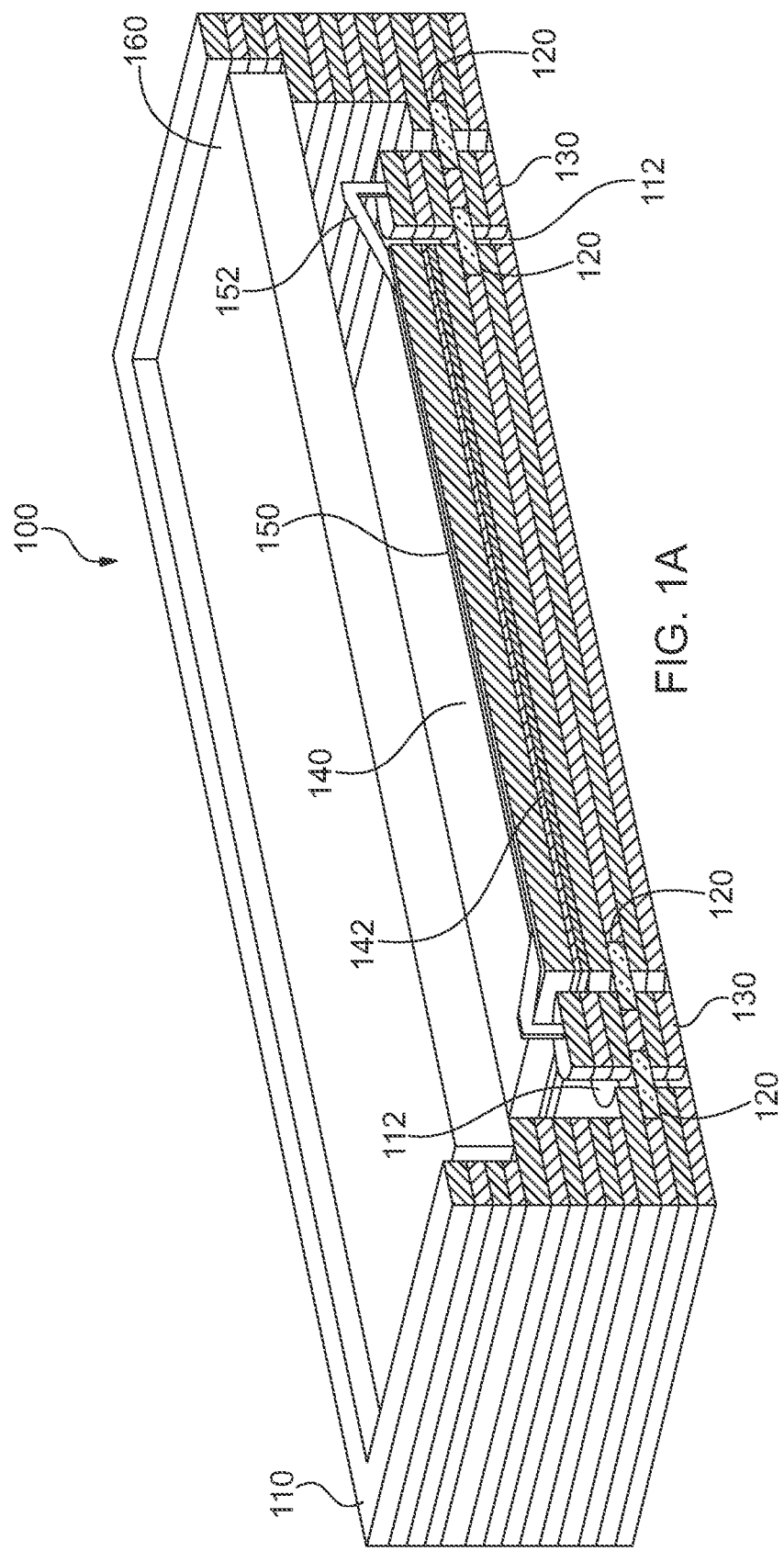
FIG. 1A schematically illustrates an isometric cut-away view of exemplary chip level packaging in accordance with the present invention.
Figure 1B:
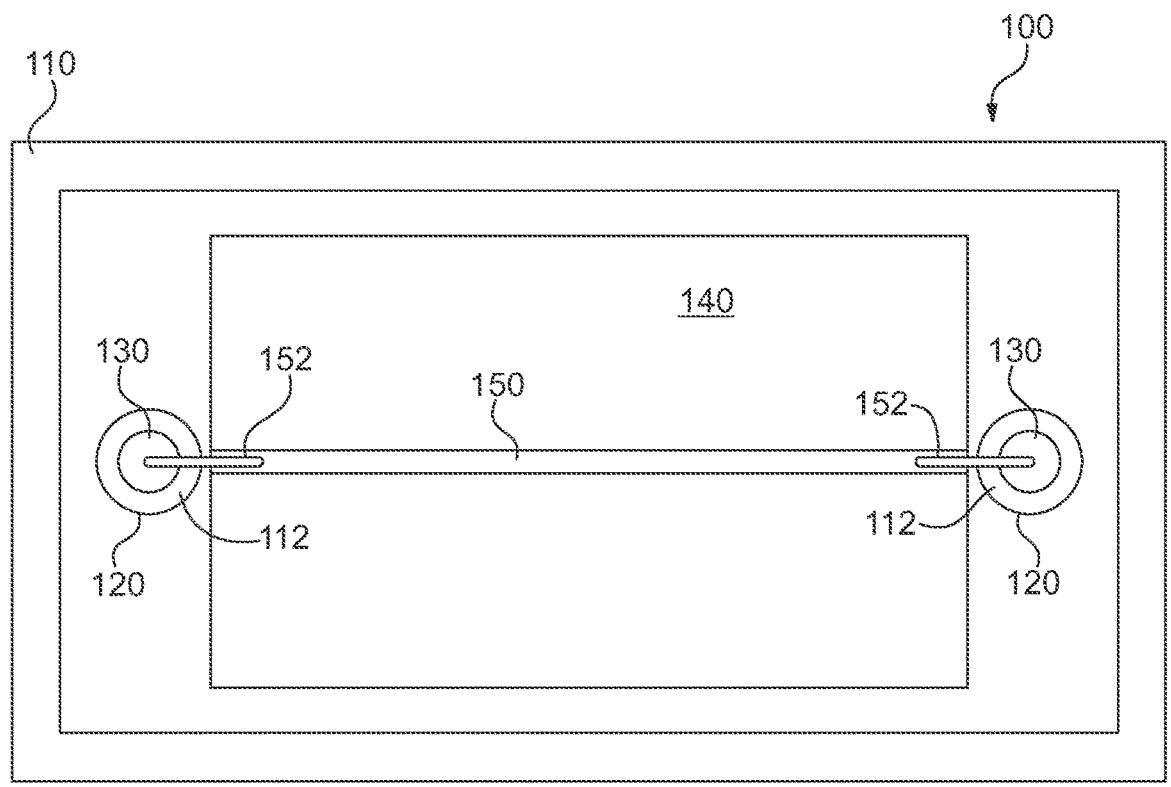
FIG. 1B schematically illustrates a top of the package of FIG. 1A with the lid removed.

The chip 140 may electrically communicate with the conductive stubs 130 via one or more wirebonds 152 which may be electrically connected to a microstrip line 150 of the chip 140, FIG. 1B. Such a configuration may be particularly suitable for RF connections through the conductive stubs 130 and aperture 112. RF connections may be designed in conjunction with the wire bonds 152 to provide a suitable match over frequencies from DC through at least 50 GHz in the current design. Further optimization can enable a good match at frequencies up to at least 100 GHz. The transition from the bottom of the conductive stub 130 into a microstrip 150 in the chip 140 can achieve an excellent match up to millimeter wave frequencies. In the preliminary design, simulations show a match better than 22 dB up to 40 GHz and better than 12.5 dB up to 50 GHz. Further tuning can enable a match better than 15 dB up to 100 GHz. For DC applications, multiple conductive stubs 330 may be provided in a single aperture 312 to provide a higher density of conductive stubs, such as a pitch as low as 0.15 mm, FIG. 1E. For the DC aperture 312 multiple conductive stubs 330 can be passed through a single dielectric layer 320.

Figure 1C:
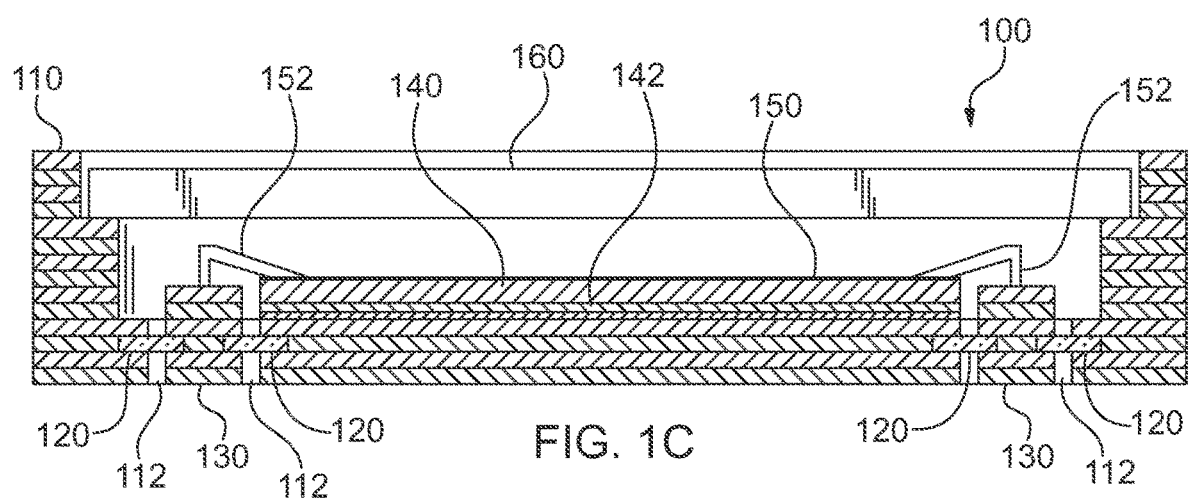
FIG. 1C schematically illustrates a side elevational view of the package of FIG. 1A.
Figure 1D:
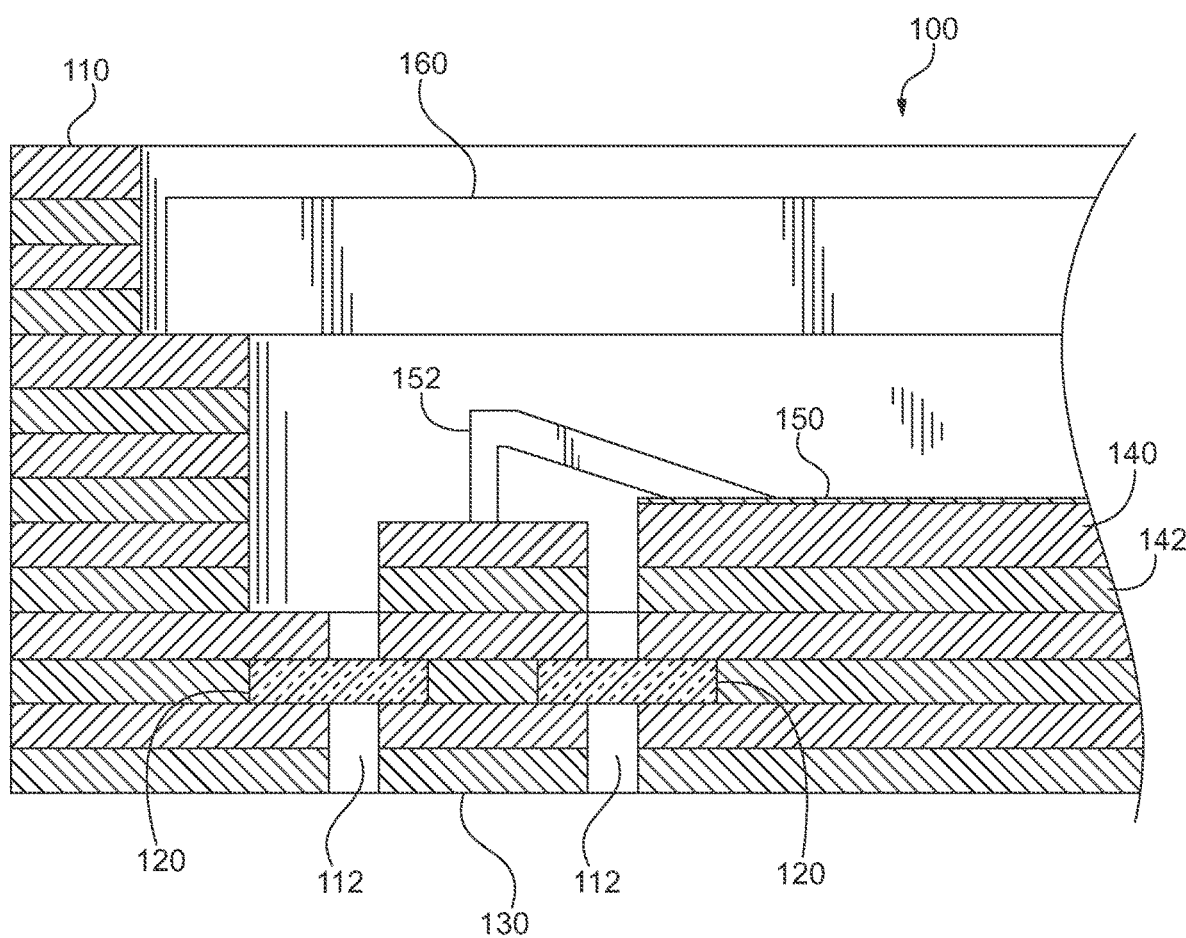
FIG. 1D schematically illustrates an enlarged view of the center conductor aperture region of the package of FIG. 1A.
Figure 1E:
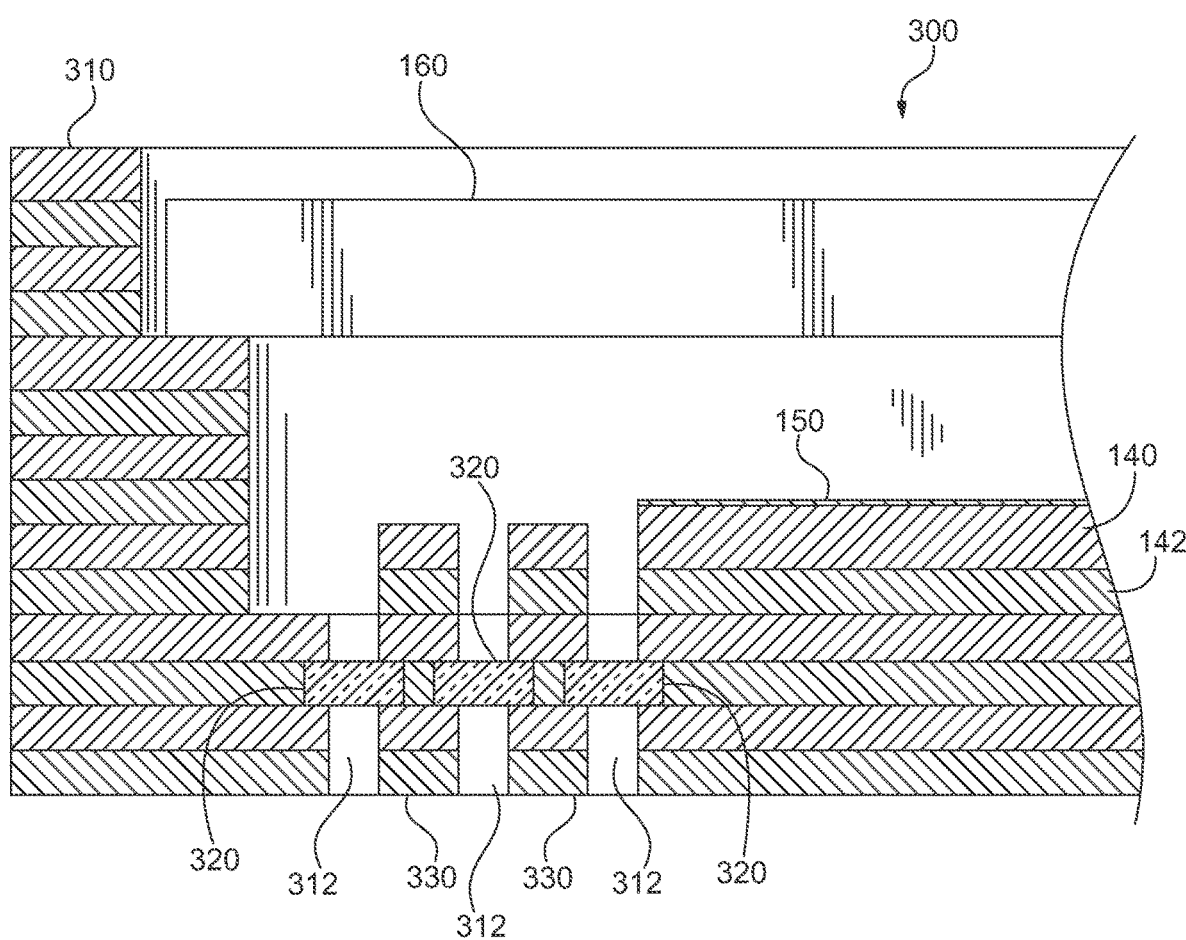
FIG. 1E schematically illustrates an enlarged view of the center conductor via region similar to that of the package of FIG. 1A but having multiple conductive stubs.
Figure 2:
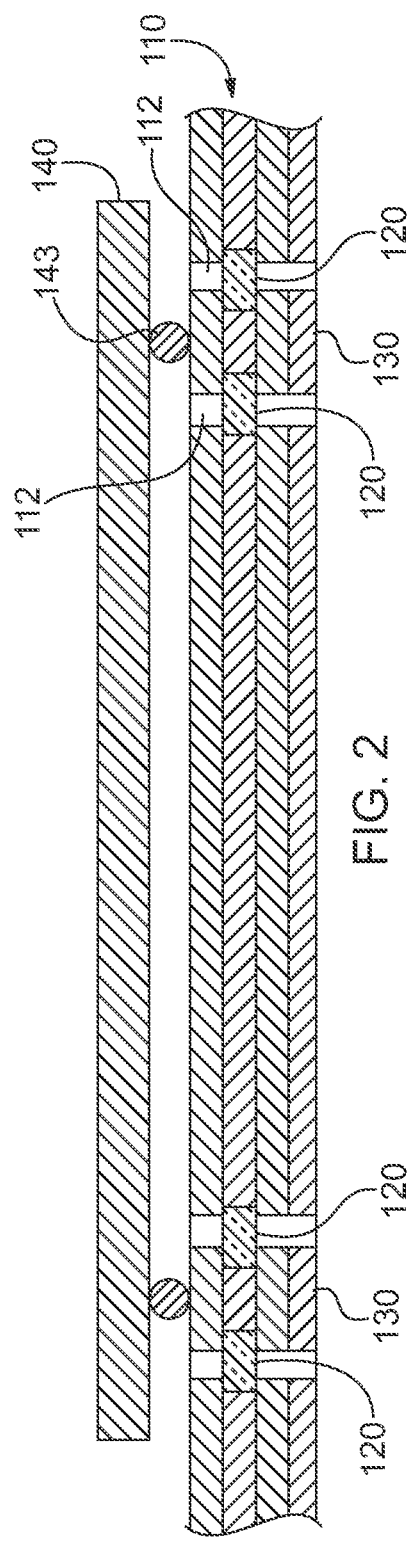
FIG. 2 schematically illustrates a fragmentary side view of the lower portion of the package of FIG. 1A with an exemplary electrical connection (solder ball) of a chip to the package center conductor.

The chip 140 may be adhered to the carrier 110 via a solder or epoxy 142, and the carrier 110 may serve as a ground, FIG. 1C. The chip 140 may alternatively electrically communicate with the conductive stubs 130 via solder 143, such as by flip-chip mounting, FIG. 2.

Figure 5:
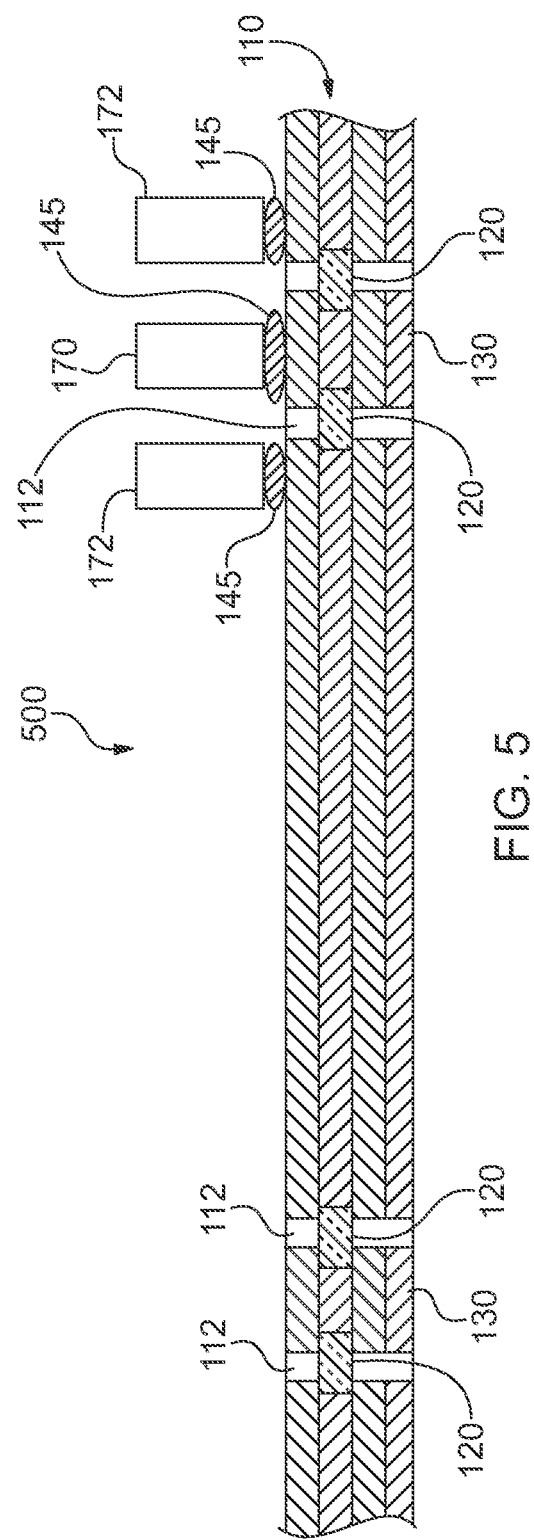
FIG. 5 schematically illustrates a side elevation cross-sectional view of the package of FIG. 2 showing transition from circular LAN pads.

One advantage to the approach of the present invention is that the conductive stubs 130, 230 can directly transition into rectangular (or other shaped) coaxial transmission lines, and microwave circuits including couplers, combiners, and filters, fabricated by PolyStrata® sequential layer build technology. An example of this is provided in FIG. 5, where the carrier 110 of FIG. 1A is electrically connected to rectangular coaxial transmission lines 170, 172 via solder 145, rather than directly to the chip 140, to provide a package 500. For instance, a region under the chip 140 may include circuits or lines, or can be solid copper to provide an efficient thermal path below the chip to a host interface. Once the chip 140 is integrated into the Poly Strata® sequential layer build technology carrier 110, the chip/carrier combination can be tested before the lid 160 is sealed allowing for rework if required. This chip/carrier combination can include one or more chips 140.

Once the package 100 has been fabricated and tested, it can be integrated with other components using several techniques. For instance, the package 100 can be directly connectorized using standard RF and DC connectors. These standard connectors can be edge launch or normal launch. However, more compacted methods for assembling multiple packages 100 together may include vertical and planar epoxy connections that can be made directly to printed circuit boards, to additional packages 100, or to other Poly Strata® sequential layer build technology boards.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention as set forth in the claims.

What is claimed is:

1. A chip scale package carrier, comprising:
a plurality of layers stacked together as a continuous stack disposed between, and parallel to, opposing upper and lower surfaces of the carrier to provide a monolithic carrier body having a cavity disposed within the plurality of layers, the upper and lower surfaces each including a respective one of the layers of the continuous stack;
a longitudinally extending passageway disposed between the between a selected exterior surface of the carrier body and the cavity, the passageway having a width measured in a plane perpendicular to a longitudinal axis of the passageway;
a chip disposed in the cavity;
a conductive stub extending through the passageway, the stub having a width less than that of the passageway, the stub electrically connected to the chip; and
a dielectric support layer disposed in the passageway, the dielectric support layer hermetically sealed to both the conductive stub and a selected layer disposed between the cavity and the selected exterior surface to create a hermetic seal within the passageway at a location between the exterior and cavity at the interior of the carrier.

2. The chip scale package carrier according to claim 1, wherein the cavity includes opposing sidewalls, the sidewalls including one or more layers of the continuous stack.

3. The chip scale package carrier according to claim 1, wherein the dielectric support is contained in the plane of the selected layer.

4. The chip scale package carrier according to claim 3, wherein the dielectric support comprises an annular disk.

5. The chip scale package carrier according to claim 3, wherein the dielectric support comprises a first portion embedded in the conductive stub.

6. The chip scale package carrier according to claim 3, wherein the dielectric support comprises a second portion embedded in the carrier at the passageway.

7. The chip scale package carrier according to claim 1, wherein the plurality of layers comprises metal.

8. The chip scale package carrier according to claim 1, wherein the passageway comprises a plurality of conductive stubs disposed therein, each stub hermetically sealed in the passageway.

9. The chip scale package carrier according to claim 1, wherein the upper surface includes an opening for receiving a lid.

10. A method of forming a chip scale package carrier, comprising
sequentially building up a plurality of layers, wherein the layers comprise one or more of a conductive material and a dielectric material, thereby forming a structure comprising:
a plurality of layers of the conductive material stacked together as a continuous stack disposed between, and parallel to, opposing upper and lower surfaces of the carrier to provide a monolithic carrier body having a cavity disposed within the plurality of layers, the upper and lower surfaces each including a respective one of the layers of the continuous stack;
a longitudinally extending passageway disposed between the between a selected exterior surface of the carrier body and the cavity, the passageway having a width measured in a plane perpendicular to a longitudinal axis of the passageway;
a conductive stub extending through the passageway, the stub having a width less than that of the passageway; and
a support layer disposed in the passageway, the support layer formed of the dielectric material and hermetically sealed to both the conductive stub and a selected conductive layer disposed between the cavity and the selected exterior surface to create a hermetic seal within the passageway at a location between the exterior and cavity at the interior of the carrier.

11. The method according to claim 10, comprising providing an electronic chip within the cavity and electrically connecting an electronic chip to the stub.

12. The method according to claim 10, wherein the cavity includes opposing sidewalls, the sidewalls including one or more layers of the conductive material.

13. The method according to claim 10, wherein the dielectric support is contained in the plane of the selected conductive layer.

14. The method according to claim 13, wherein the dielectric support comprises an annular disk.

15. The method according to claim 13, wherein the dielectric support comprises a first portion embedded in the conductive stub.

16. The method according to claim 13, wherein the dielectric support comprises a second portion embedded in the carrier at the passageway.

17. The method according to claim 10, wherein the plurality of layers comprises metal.

18. The method according to claim 10, wherein the passageway comprises a plurality of conductive stubs disposed therein, each stub hermetically sealed in the passageway.

19. The method according to claim 10, wherein the upper surface includes an opening for receiving a lid.

* * * * *